(12) United States Patent
Lin et al.

(10) Patent No.: US 12,009,215 B2
(45) Date of Patent: Jun. 11, 2024

(54) SEMICONDUCTOR DEVICE STRUCTURE WITH SILICIDE LAYER

(71) Applicant: Taiwan Semiconductor Manufacturing Company, Ltd., Hsinchu (TW)

(72) Inventors: Chun-Hsiung Lin, Zhubei (TW); Jung-Hung Chang, Changhua County (TW); Shih-Cheng Chen, New Taipei (TW); Kuo-Cheng Chiang, Zhubei (TW); Chih-Hao Wang, Baoshan Township, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/305,074

(22) Filed: Apr. 21, 2023

(65) Prior Publication Data

US 2023/0260793 A1  Aug. 17, 2023

Related U.S. Application Data

(63) Continuation of application No. 17/397,126, filed on Aug. 9, 2021, now Pat. No. 11,664,230, which is a continuation of application No. 16/995,223, filed on Aug. 17, 2020, now Pat. No. 11,087,988, which is a continuation of application No. 16/539,225, filed on Aug. 13, 2019, now Pat. No. 10,748,775.

(Continued)

(51) Int. Cl.
*H01L 29/06* (2006.01)
*H01L 21/285* (2006.01)
*H01L 21/764* (2006.01)
*H01L 29/45* (2006.01)
*H01L 29/66* (2006.01)
*H01L 29/78* (2006.01)

(52) U.S. Cl.
CPC ...... *H01L 21/28518* (2013.01); *H01L 21/764* (2013.01); *H01L 29/0653* (2013.01); *H01L 29/45* (2013.01); *H01L 29/6653* (2013.01); *H01L 29/66795* (2013.01); *H01L 29/7851* (2013.01); *H01L 2029/7858* (2013.01)

(58) Field of Classification Search
CPC ............ H01L 21/28518; H01L 21/764; H01L 29/0653; H01L 29/45; H01L 29/6653; H01L 29/66795; H01L 29/7851; H01L 2029/7858; H01L 21/76843; H01L 21/76855; H01L 21/823431; H01L 29/41791; H01L 29/66545
See application file for complete search history.

(56) References Cited

U.S. PATENT DOCUMENTS

2008/0111199 A1  5/2008  Kim et al.
2015/0303118 A1  10/2015 Wang et al.
(Continued)

*Primary Examiner* — Elias Ullah
(74) *Attorney, Agent, or Firm* — Birch, Stewart, Kolasch & Birch, LLP

(57) ABSTRACT

A semiconductor device structure is provided. The semiconductor device structure includes a substrate having a base portion and a fin portion over the base portion. The semiconductor device structure includes an epitaxial structure over the fin portion. The semiconductor device structure includes a dielectric fin over the base portion. The semiconductor device structure includes a silicide layer between the dielectric fin and the epitaxial structure. A void is between the silicide layer and the dielectric fin.

20 Claims, 20 Drawing Sheets

Related U.S. Application Data

(60) Provisional application No. 62/738,237, filed on Sep. 28, 2018.

(56) References Cited

U.S. PATENT DOCUMENTS

| | | |
|---|---|---|
| 2017/0018463 A1 | 1/2017 | Bu et al. |
| 2018/0122800 A1 | 5/2018 | Cheng et al. |
| 2018/0151439 A1 | 5/2018 | Huang |

SEMICONDUCTOR DEVICE STRUCTURE WITH SILICIDE LAYER

PRIORITY CLAIM AND CROSS-REFERENCE

This application is a Continuation of U.S. application Ser. No. 17/397,126, filed on Aug. 9, 2021, which is a Continuation of U.S. application Ser. No. 16/995,223, filed on Aug. 17, 2020, which is a Continuation of U.S. application Ser. No. 16/539,225, filed on Aug. 13, 2019, which claims the benefit of U.S. Provisional Application No. 62/738,237, filed on Sep. 28, 2018, the entirety of which is incorporated by reference herein.

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

FIG. 2H-1 is a perspective view of the semiconductor device structure of FIG. 2H, in accordance with some embodiments.

DETAILED DESCRIPTION

Figure 1A:
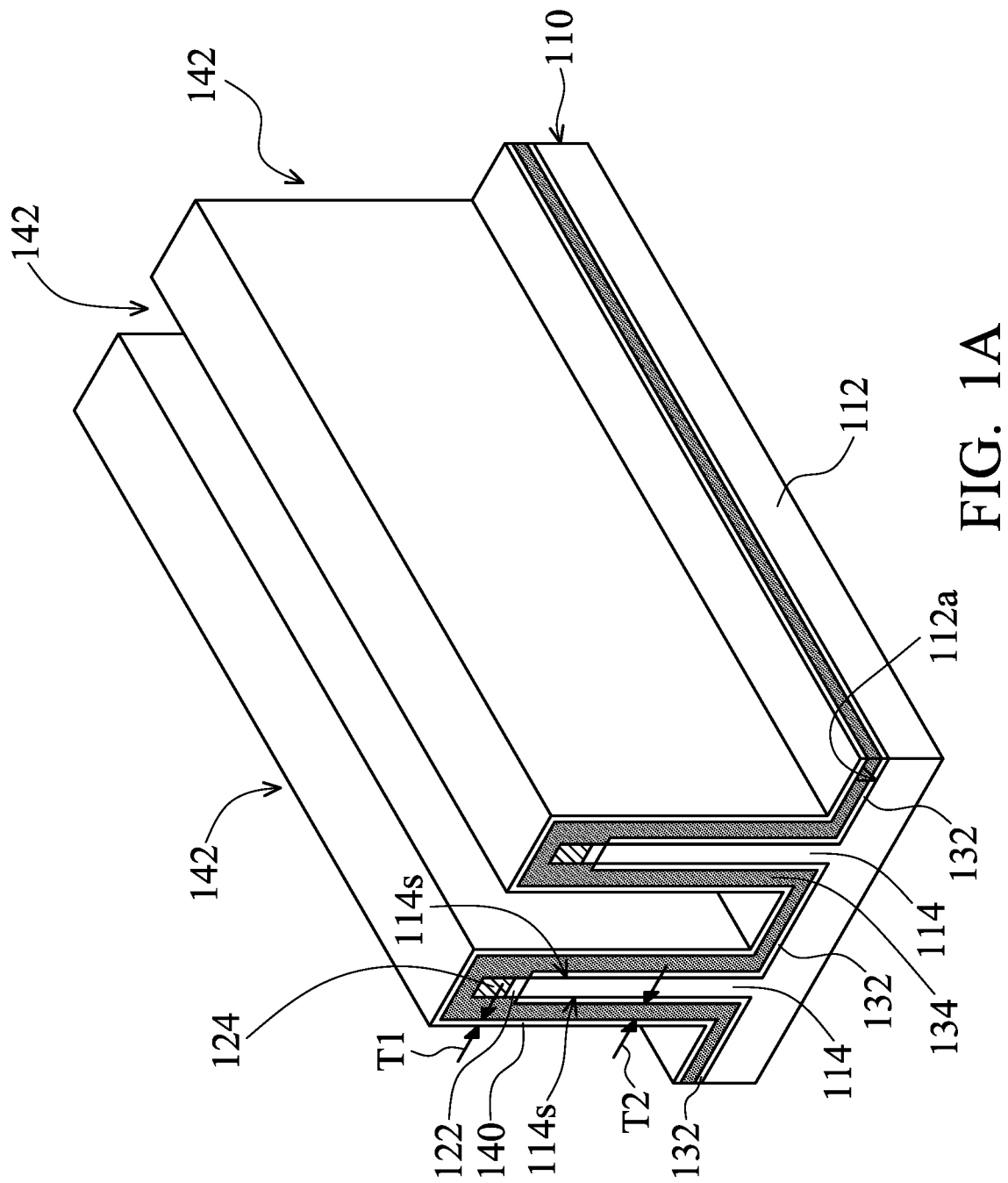
FIGS. 1A-1G are perspective views of various stages of a process for forming a semiconductor device structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Embodiments of the disclosure form a semiconductor device structure with FinFETs. The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

FIGS. 1A-1G are perspective views of various stages of a process for forming a semiconductor device structure, in accordance with some embodiments. As shown in FIG. 1A, a substrate 110 is provided, in accordance with some embodiments. In some embodiments, the substrate 110 is a semiconductor substrate, such as a bulk semiconductor substrate, a semiconductor-on-insulator (SOI) substrate, or the like, which may be doped (e.g. with a P-type dopant or an N-type dopant) or undoped. In some embodiments, the substrate 110 is a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate.

Other substrates, such as a multi-layered or gradient substrate may also be used. In some embodiments, the semiconductor material of the substrate 110 includes silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or a combination thereof. In some embodiments, the substrate 110 includes silicon.

Afterwards, the substrate 110 is patterned, in accordance with some embodiments. The substrate 110 has a base portion 112 and fin portions 114, in accordance with some embodiments. The fin portions 114 are over the base portion 112, in accordance with some embodiments. The fin portions 114 are spaced apart from each other, in accordance with some embodiments.

In some embodiment, before the substrate 110 is patterned, a first mask layer 122 and a second mask layer 124 may be successively formed over the substrate 110. In some embodiments, the first mask layer 122 serves a buffer layer or an adhesion layer that is formed between the underlying substrate 110 and the overlying second mask layer 124. The first mask layer 122 may also be used as an etch stop layer when the second mask layer 124 is removed or etched.

In some embodiments, the first mask layer 122 is made of silicon oxide. In some embodiments, the first mask layer 122 is formed by a deposition process, such as a chemical vapor deposition (CVD) process, a low-pressure chemical vapor deposition (LPCVD) process, a plasma enhanced chemical vapor deposition (PECVD) process, a high-density plasma chemical vapor deposition (HDPCVD) process, a spin-on process, or another applicable process.

In some embodiments, the second mask layer 124 is made of silicon oxide, silicon nitride, silicon oxynitride, or another applicable material. In some embodiments, the second mask layer 124 is formed by a deposition process, such as a chemical vapor deposition (CVD) process, a low-pressure chemical vapor deposition (LPCVD) process, a plasma enhanced chemical vapor deposition (PECVD) process, a high-density plasma chemical vapor deposition (HDPCVD) process, a spin-on process, or another applicable process.

After the formation of the first mask layer 122 and the second mask layer 124, the first mask layer 122 and the overlying second mask layer 124 are patterned by a photolithography process and an etching process, so as to expose portions of the substrate 110. For example, the photolithography process may include photoresist coating (e.g., spin-on coating), soft baking, mask aligning, exposure, post-exposure baking, developing the photoresist, rinsing and drying (e.g., hard baking). Moreover, the etching process may be a dry etching process, such as a reactive ion etching (RIE) process, an neutral beam etching (NBE) process, the like, or a combination thereof.

Afterwards, an etching process is performed on the substrate 110 to form the fin portions 114 by using the patterned first mask layer 122 and the patterned second mask layer 124 as an etch mask. In some embodiments, the etching process includes a dry etching process or a wet etching process. In some embodiments, the substrate 110 is etched by a dry etching process, such as an RIE process, an NBE process, the like, or a combination thereof. The dry etching process may be performed using a process gas including fluorine-based etchant gas. For example, the process gas may include $SF_6$, $C_xF_y$ (x and y are both integers), $NF_3$ or a combination thereof.

In some other embodiments, the fin portions 114 have tapered sidewalls. For example, each of the fin portions 114 has a width that gradually increases from the top portion to the lower portion. The fin portion 114 has opposite sidewalls 114s, in accordance with some embodiments. The base portion 112 has a top surface 112a, in accordance with some embodiments.

As shown in FIG. 1A, a liner layer 132 is formed over the base portion 112 and the fin portions 114, in accordance with some embodiments. The liner layer 132 conformally covers the top surface 112a of the base portion 112 and the sidewalls 114s of the fin portions 114, in accordance with some embodiments. The liner layer 132 includes oxide (such as silicon oxide), in accordance with some embodiments. The liner layer 132 is formed by a thermal oxidation process, in accordance with some embodiments.

As shown in FIG. 1A, a dielectric layer 134 is formed over the liner layer 132, the first mask layer 122, and the second mask layer 124, in accordance with some embodiments. The dielectric layer 134 conformally covers the liner layer 132, the first mask layer 122, and the second mask layer 124, in accordance with some embodiments.

In some embodiments, the dielectric layer 134 is made of oxide (such as silicon oxide), fluorosilicate glass (FSG), a low-k dielectric material, and/or another suitable dielectric material. The dielectric layer 134 may be deposited by an atomic layer deposition (ALD) process, a chemical vapor deposition (CVD) process, or another applicable process.

As shown in FIG. 1A, a spacer material layer 140 is formed over the dielectric layer 134, in accordance with some embodiments. The spacer material layer 140 conformally covers the dielectric layer 134, in accordance with some embodiments. The spacer material layer 140 has trenches 142 between the fin portions 114, in accordance with some embodiments. In some embodiments, a thickness T1 of the spacer material layer 140 ranges from about 2 nm to about 10 nm. The thickness T1 ranges from about 2 nm to about 3 nm, in accordance with some embodiments. The thickness T1 of the spacer material layer 140 is less than a thickness T2 of the dielectric layer 134, in accordance with some embodiments.

The spacer material layer 140 is made of oxide (e.g., silicon oxide), nitride (e.g., silicon nitride, silicon carbon nitride, silicon oxycarbon nitride, titanium nitride, or tantalum nitride), carbide (e.g., silicon oxycarbide), metal oxide (e.g., oxides of Li, Be, Mg, Ca, Sr, Sc, Y, Zr, Al, La, Ce, Pr, Nd, Sm, Eu, Gd, Tb, Dy, Ho, Hf, Er, Tm, Yb, Lu, and/or mixtures thereof), or another suitable insulating material, in accordance with some embodiments.

In some embodiments, the spacer material layer 140 and the dielectric layer 134 are made of different materials with different etching rates under an etchant. The spacer material layer 140 is formed using a deposition process, such as a chemical vapor deposition (CVD) process, an atomic layer deposition (ALD) process, or a physical vapor deposition (PVD) process, in accordance with some embodiments.

Figure 1B:
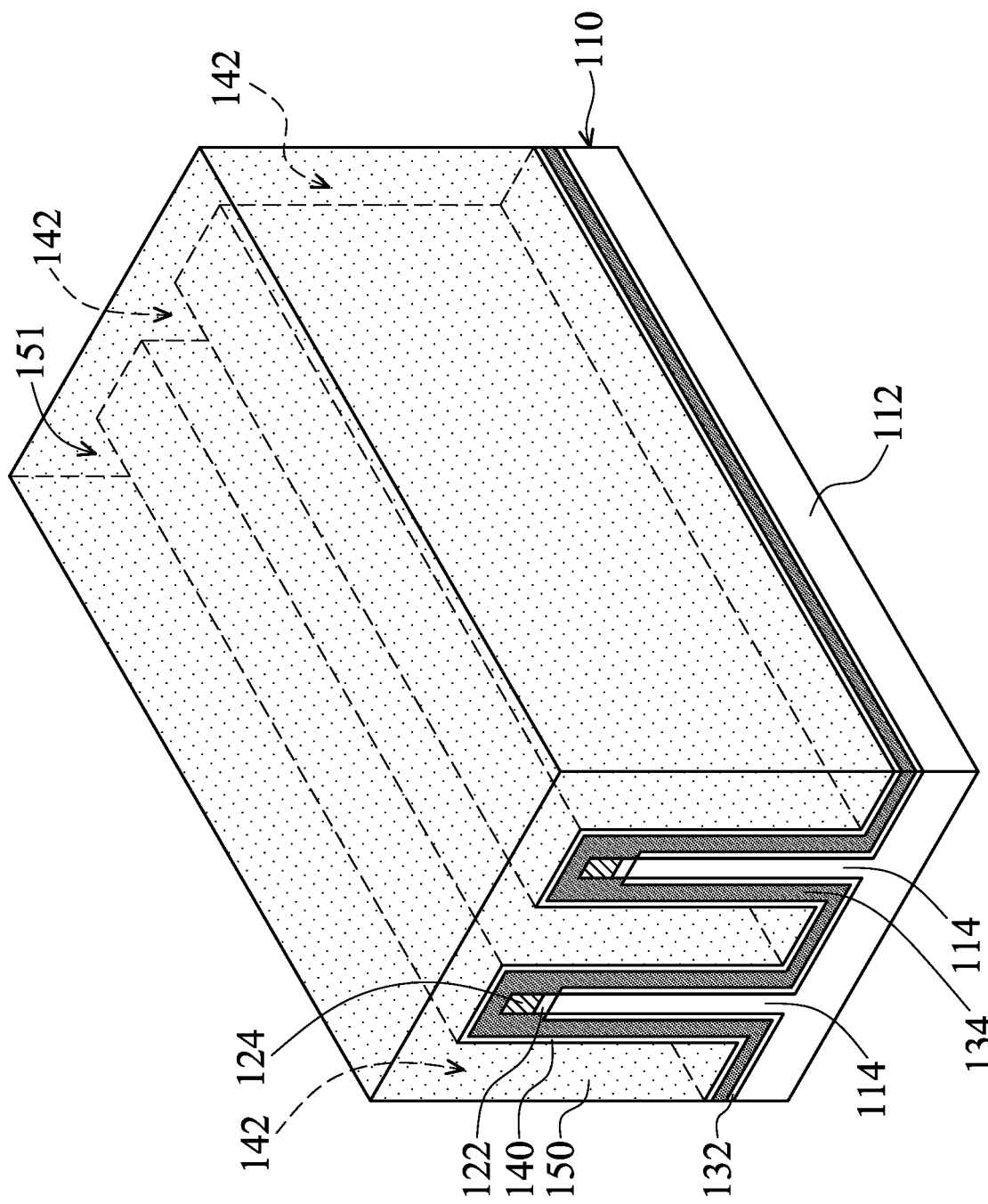

As shown in FIG. 1B, a dielectric layer 150 is formed over the spacer material layer 140, in accordance with some embodiments. The trenches 142 of the spacer material layer 140 are filled with the dielectric layer 150, in accordance with some embodiments.

The dielectric layer 150 is made of oxide (e.g., silicon oxide), nitride (e.g., silicon nitride, silicon carbon nitride, silicon oxycarbon nitride, titanium nitride, or tantalum nitride), carbide (e.g., silicon oxycarbide), metal oxide (e.g., oxides of Li, Be, Mg, Ca, Sr, Sc, Y, Zr, Al, La, Ce, Pr, Nd, Sm, Eu, Gd, Tb, Dy, Ho, Hf, Er, Tm, Yb, Lu, and/or mixtures thereof), or another suitable insulating material, in accordance with some embodiments.

In some embodiments, the dielectric layer 150, the spacer material layer 140 and the dielectric layer 134 are made of different materials with different etching rates under an etchant. The dielectric layer 150 is formed using a deposition process, such as a chemical vapor deposition (CVD) process, an atomic layer deposition (ALD) process, or a physical vapor deposition (PVD) process, in accordance with some embodiments.

Figure 1C:
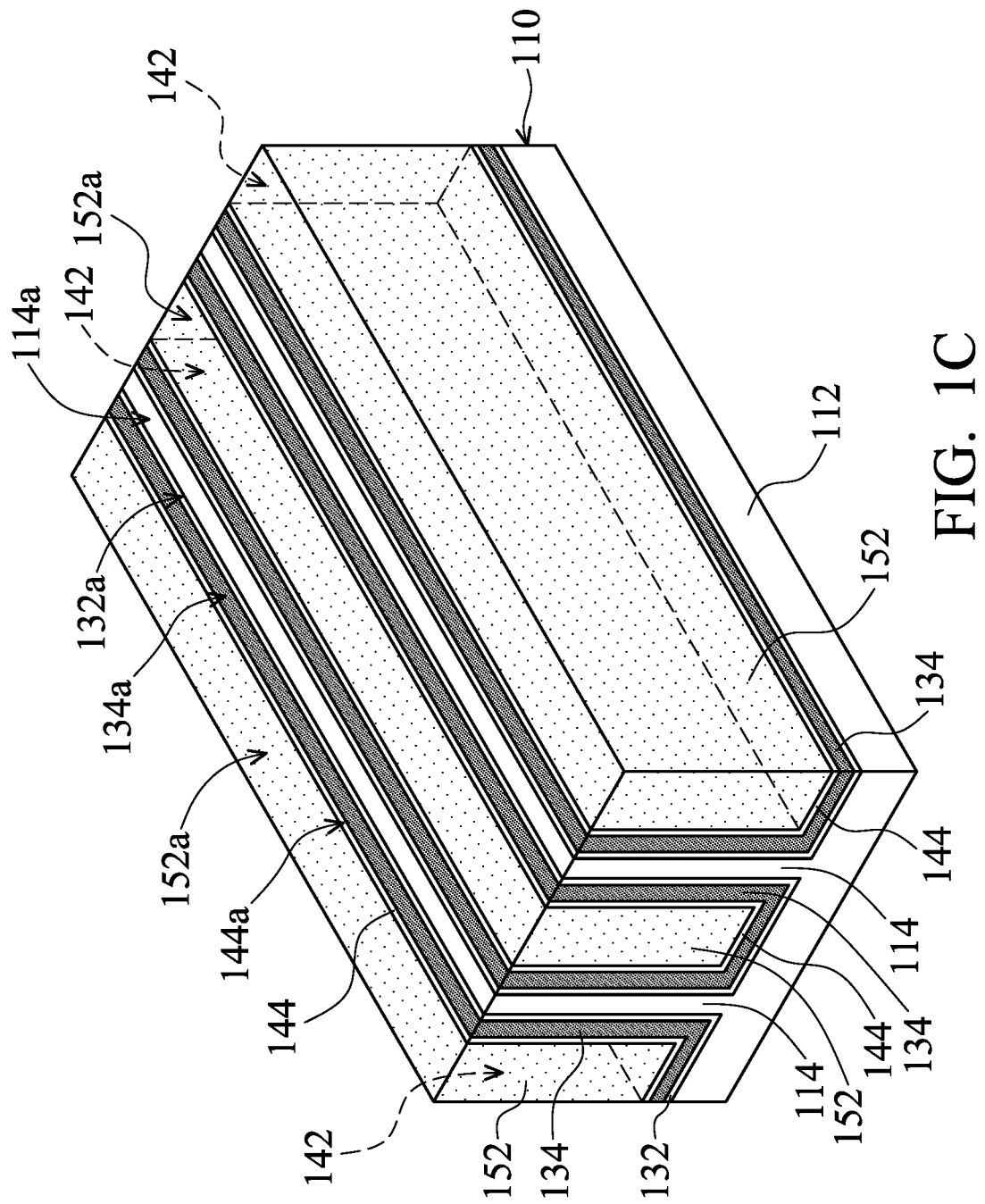

As shown in FIGS. 1B and 1C, top portions of the dielectric layer 150, the spacer material layer 140, the dielectric layer 134, the first mask layer 122, and the second mask layer 124 are removed, in accordance with some embodiments. In some embodiments, top portions of the fin portions 114 are also removed.

After the removal process, the spacer material layer 140 is divided into spacer layers 144, in accordance with some embodiments. The spacer layers 144 are separated from each other by the fin portions 114, the liner layer 132, and the dielectric layer 134, in accordance with some embodiments. Each fin portion 114 is between two adjacent spacer layers 144, in accordance with some embodiments.

After the removal process, the dielectric layer 150 remaining in the trenches 142 forms dielectric fins 152, in accordance with some embodiments. The dielectric fins 152 are separated from each other by the spacer layers 144, the fin portions 114, the liner layer 132, and the dielectric layer 134, in accordance with some embodiments. The spacer layer 144 wraps around the dielectric fin 152 thereover, in accordance with some embodiments. The spacer layer 144 separates the dielectric fin 152 from the fin portions 114 and the base portion 112, in accordance with some embodiments.

In some embodiments, top surfaces 152a, 144a, 114a, 132a, and 134a of the dielectric fins 152, the spacer layers 144, the fin portions 114, the liner layer 132, and the dielectric layer 134 are substantially coplanar with (or aligned with) each other, in accordance with some embodiments. The term "substantially coplanar" in the application may include small deviations from coplanar geometries. The deviations may be due to manufacturing processes.

The removal process includes performing a thinning process on a top surface 151 of the dielectric layer 150, in accordance with some embodiments. The thinning process includes a chemical mechanical polishing (CMP) process, in accordance with some embodiments.

Figure 1D:
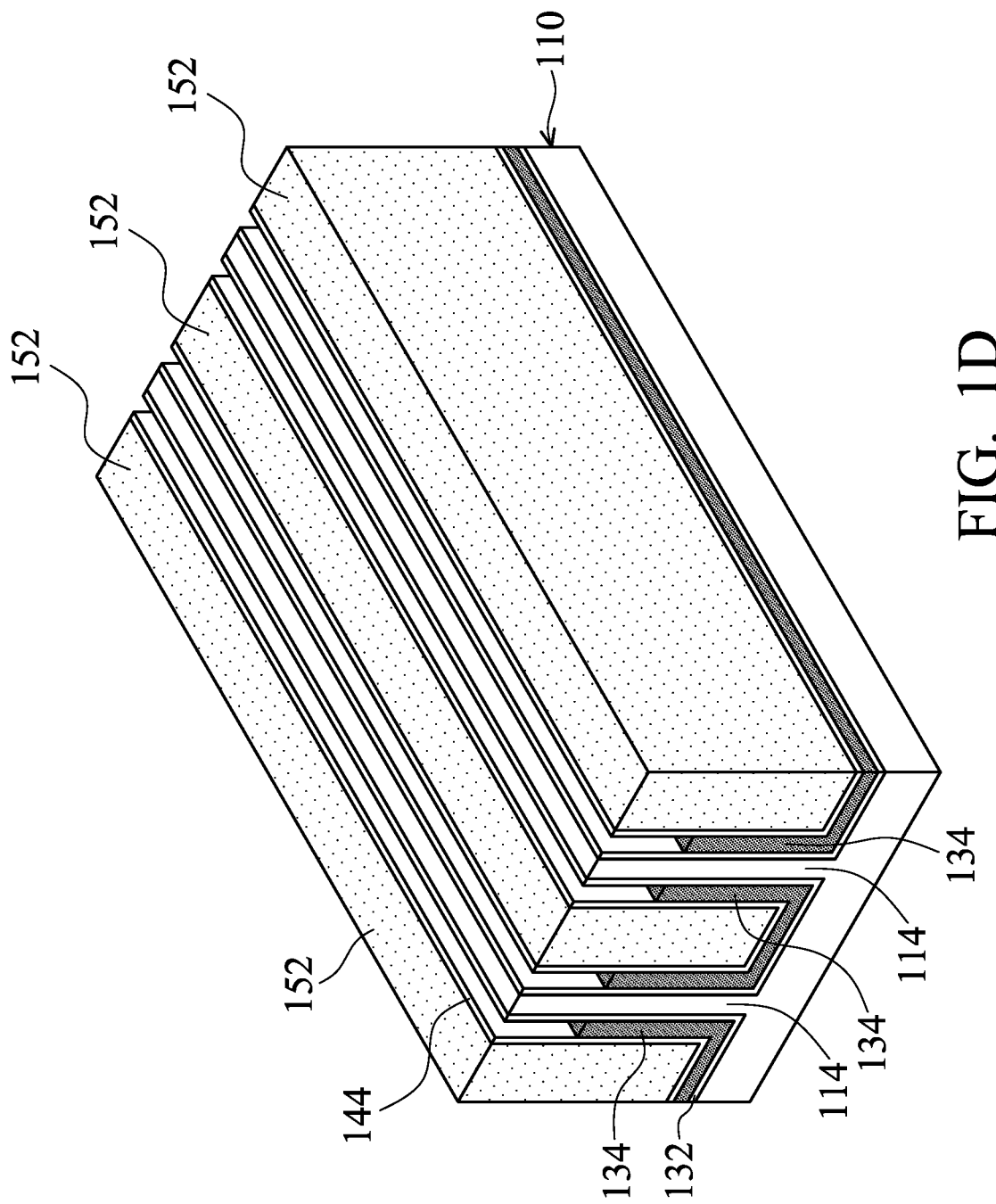

As shown in FIG. 1D, upper portions of the dielectric layer 134 are removed, in accordance with some embodiments. The removal process includes an etching process, such as a dry etching process or a wet etching process, in accordance with some embodiments.

Figure 1E:
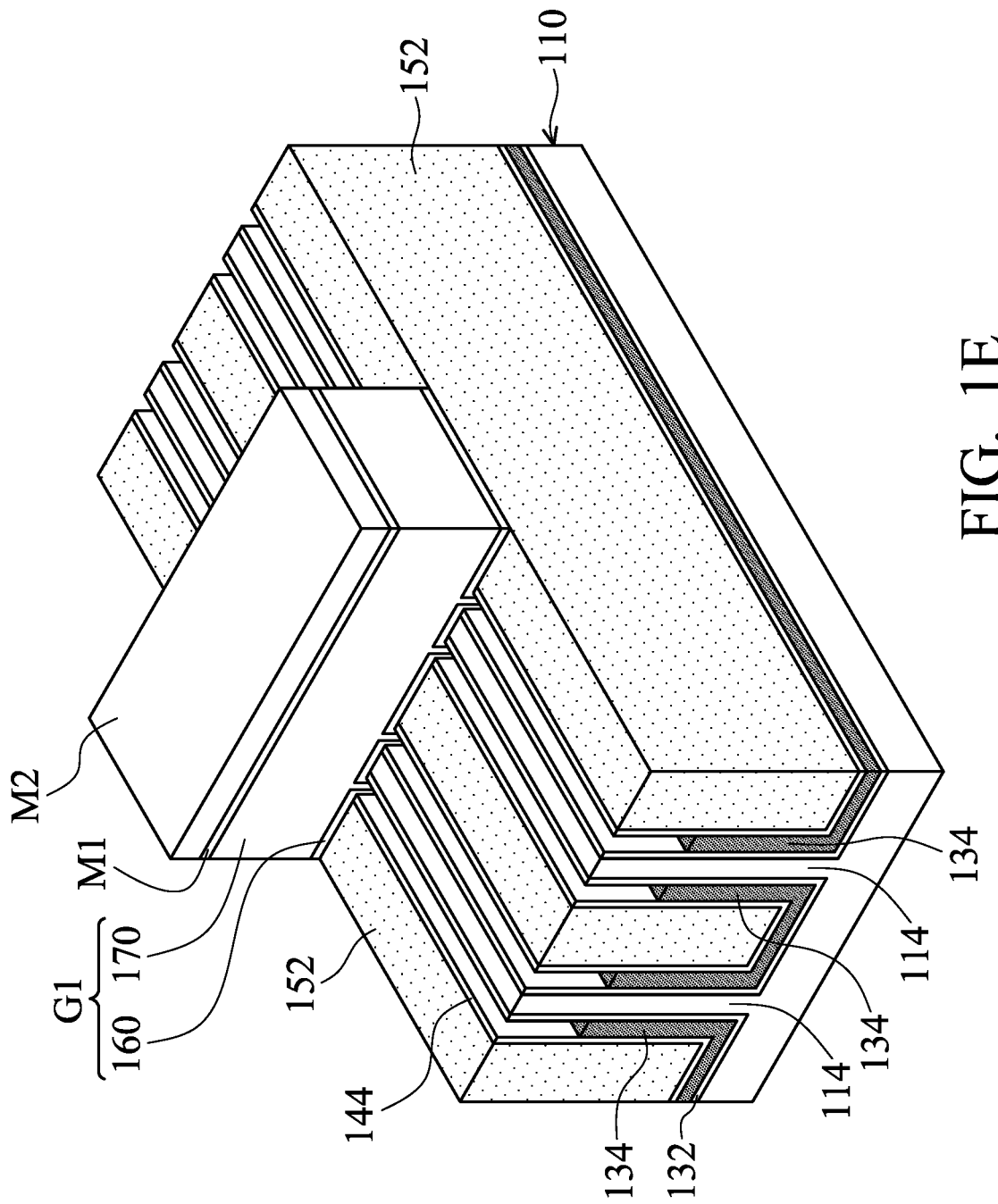

As shown in FIG. 1E, a gate dielectric layer 160, a gate electrode 170, and mask layers M1 and M2 are formed over the liner layer 132, the dielectric layer 134, the spacer layers 144, and the dielectric fins 152, in accordance with some embodiments. The gate dielectric layer 160 and the gate electrode 170 together form a gate stack G1, in accordance with some embodiments.

The gate dielectric layer 160 conformally and partially covers the liner layer 132, the dielectric layer 134, the spacer layers 144, and the dielectric fins 152, in accordance with some embodiments. The gate electrode 170 is over the gate dielectric layer 160, in accordance with some embodiments. The gate dielectric layer 160 is made of an insulating material, such as oxide (e.g., silicon oxide), in accordance with some embodiments. The gate electrode 170 is made of a conductive material (e.g., metal or alloy) or a semiconductor material (e.g. polysilicon), in accordance with some embodiments.

The formation of the gate dielectric layer 160 and the gate electrode 170 includes: depositing a gate dielectric material layer (not shown) over the liner layer 132, the dielectric layer 134, the spacer layers 144, and the dielectric fins 152; depositing a gate electrode material layer (not shown) over the gate dielectric material layer; sequentially forming the mask layers M1 and M2 over the gate electrode material layer, wherein the mask layers M1 and M2 expose portions of the gate electrode material layer; and removing the exposed portions of the gate electrode material layer and the gate dielectric material layer thereunder.

In some embodiments, the mask layer M1 serves a buffer layer or an adhesion layer that is formed between the underlying gate electrode 170 and the overlying mask layer M2. The mask layer M1 may also be used as an etch stop layer when the mask layer M2 is removed or etched.

In some embodiments, the mask layer M1 is made of silicon oxide. In some embodiments, the mask layer M1 is formed by a deposition process, such as a chemical vapor deposition (CVD) process, a low-pressure chemical vapor deposition (LPCVD) process, a plasma enhanced chemical vapor deposition (PECVD) process, a high-density plasma chemical vapor deposition (HDPCVD) process, a spin-on process, or another applicable process.

In some embodiments, the mask layer M2 is made of silicon oxide, silicon nitride, silicon oxynitride, or another applicable material. In some embodiments, the mask layer M2 is formed by a deposition process, such as a chemical vapor deposition (CVD) process, a low-pressure chemical vapor deposition (LPCVD) process, a plasma enhanced chemical vapor deposition (PECVD) process, a high-density plasma chemical vapor deposition (HDPCVD) process, a spin-on process, or another applicable process.

After the formation of the mask layer M1 and the mask layer M2, the mask layer M1 and the overlying mask layer M2 are patterned by a photolithography process and an etching process, so as to expose the portions of the gate electrode material layer.

Figure 1F:
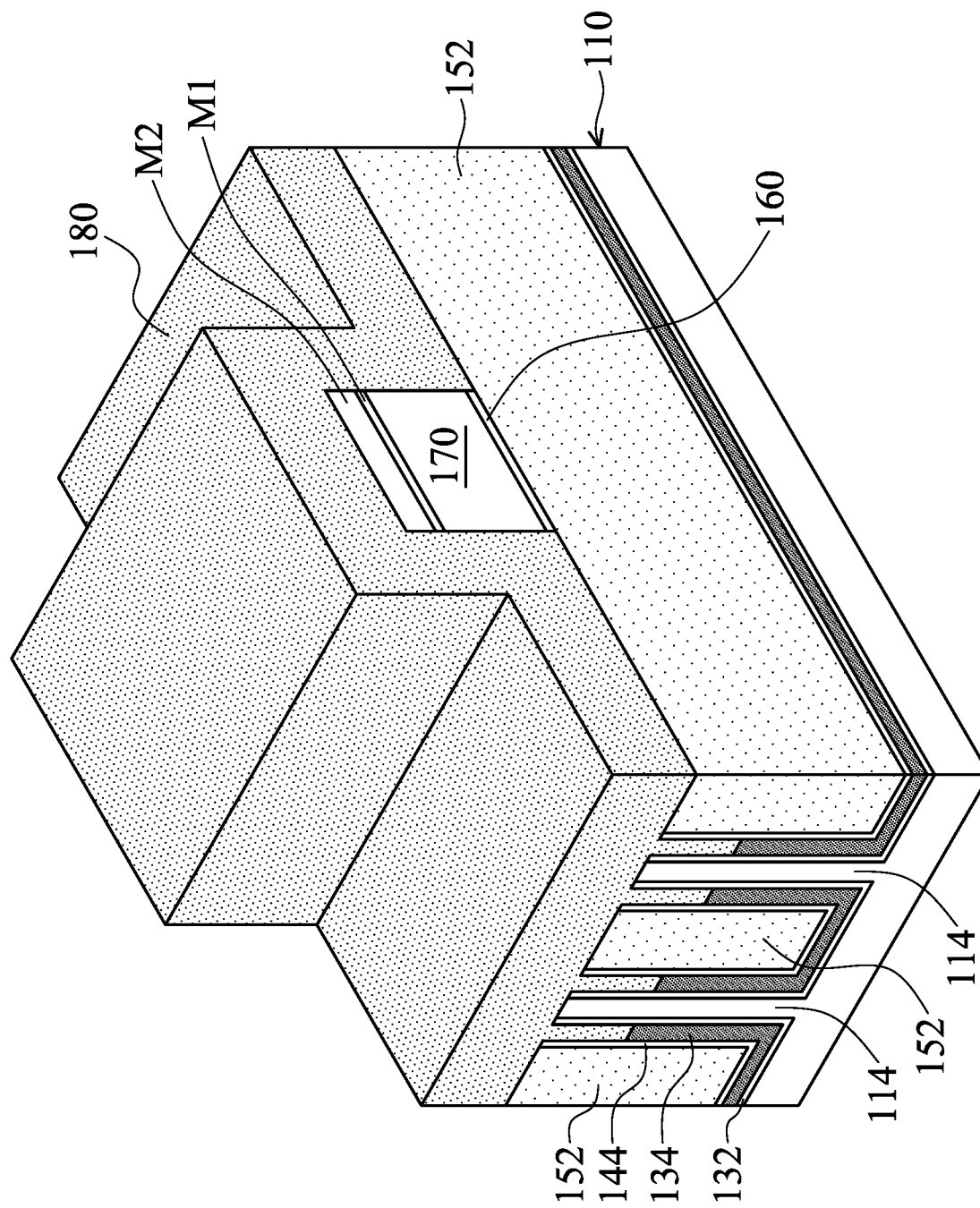

As shown in FIG. 1F, a spacer layer 180 is formed over the liner layer 132, the dielectric layer 134, the spacer layers 144, the dielectric fins 152, the gate dielectric layer 160, the gate electrode 170, and the mask layers M1 and M2, in accordance with some embodiments. The spacer layer 180 is a single-layered structure or a multi-layered structure, in accordance with some embodiments.

The spacer layer 180 is made of an insulating material, such as silicon nitride, silicon oxide, silicon carbide, silicon oxynitride, or another applicable insulating material. The spacer layer 180 is formed using a deposition process, such as a chemical vapor deposition (CVD) process, an atomic layer deposition (ALD) process, or a physical vapor deposition (PVD) process, in accordance with some embodiments.

Figure 1G:
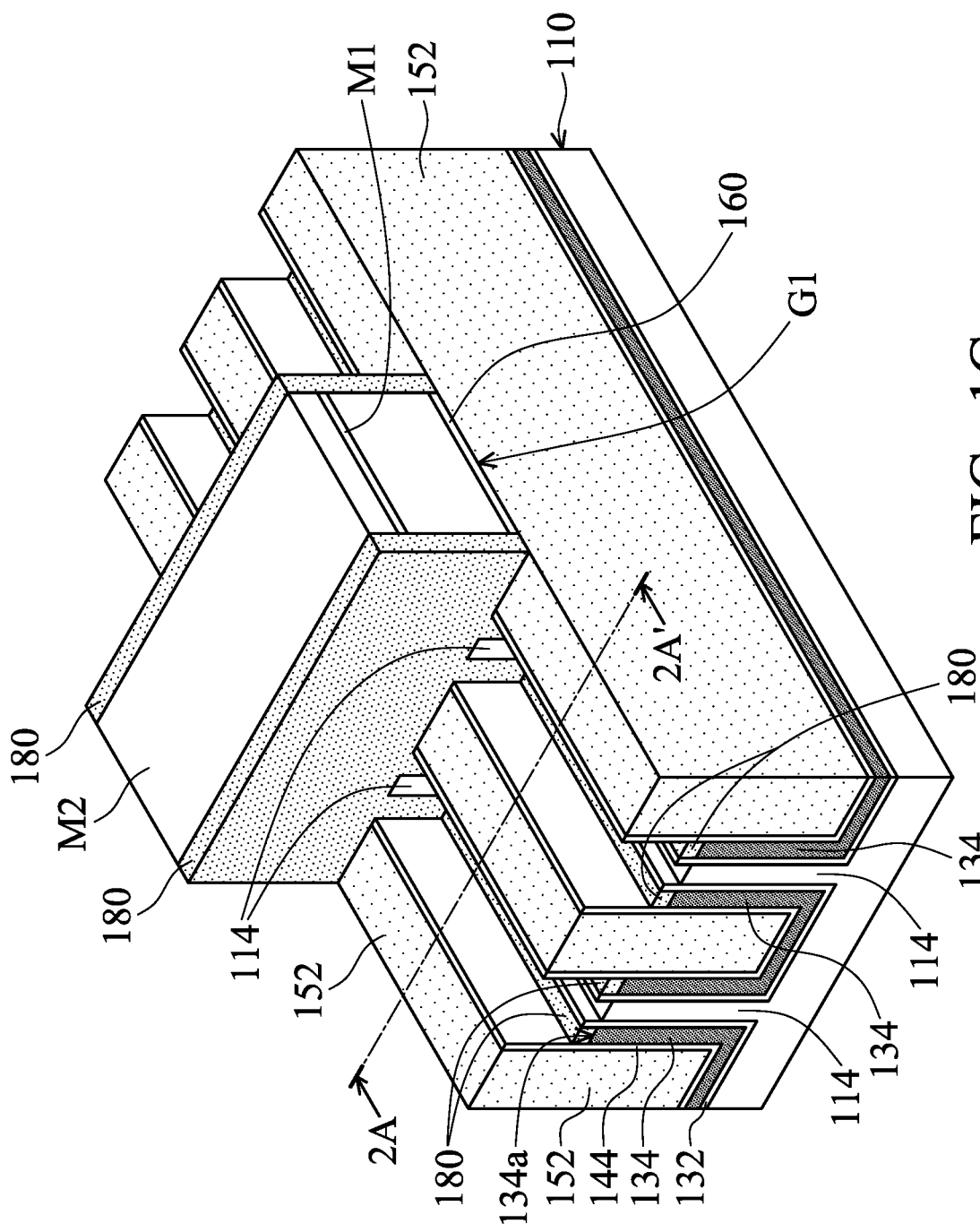
Figure 2A:
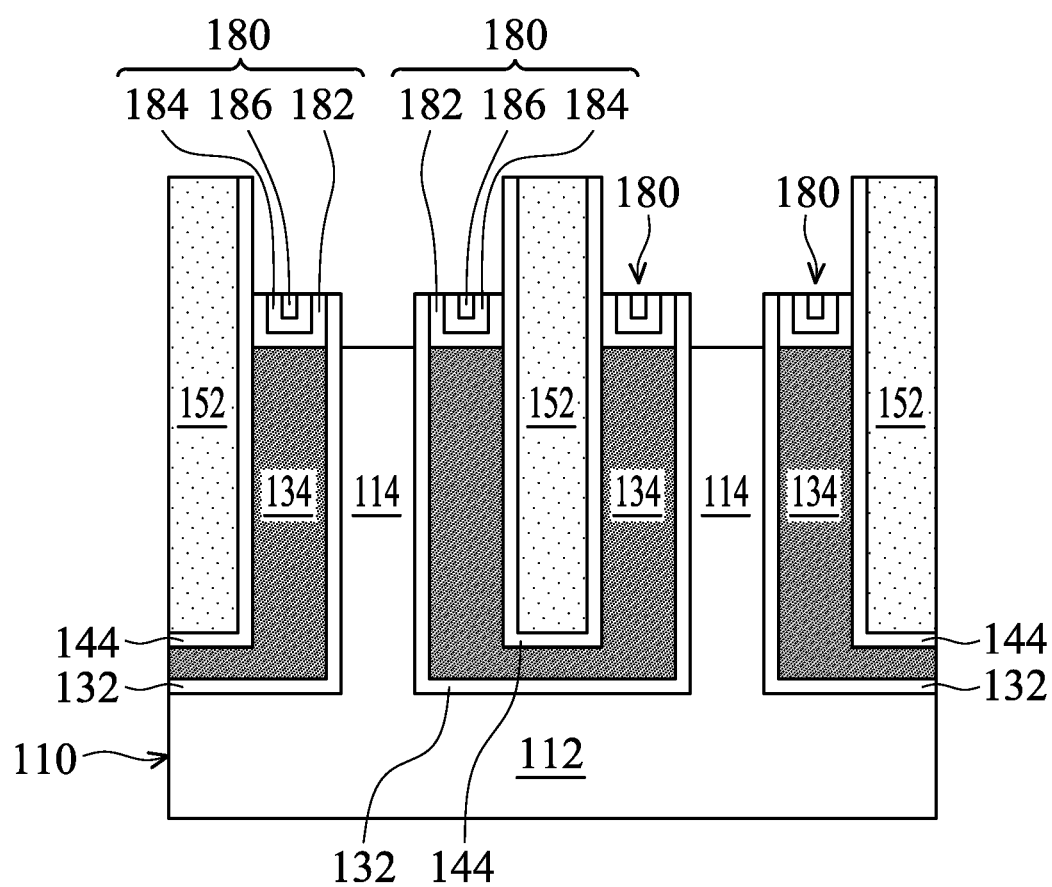
FIGS. 2A-2H are cross-sectional views of various stages of a process for forming a semiconductor device structure, in accordance with some embodiments.

FIG. 2A is a cross-sectional view illustrating the semiconductor device structure along a sectional line 2A-2A' in FIG. 1G, in accordance with some embodiments. As shown in FIGS. 1G and 2A, portions of the spacer layer 180 and upper portions of the fin portions 114 are removed, in accordance with some embodiments. After the removal process, the spacer layer 180 remains over opposite sidewalls of the gate stack G1, opposite sidewalls of the mask layers M1 and M2, and the top surfaces 134a of the dielectric layer 134, in accordance with some embodiments. The removal process includes an etching process, such as an anisotropic etching process, in accordance with some embodiments.

In some embodiments, as shown in FIG. 2A, the spacer layer 180 is a multi-layered structure. The spacer layer 180 includes layers 182, 184, and 186, in accordance with some embodiments. The layers 182, 184, and 186 are made of different materials, in accordance with some embodiments.

Figure 2B:
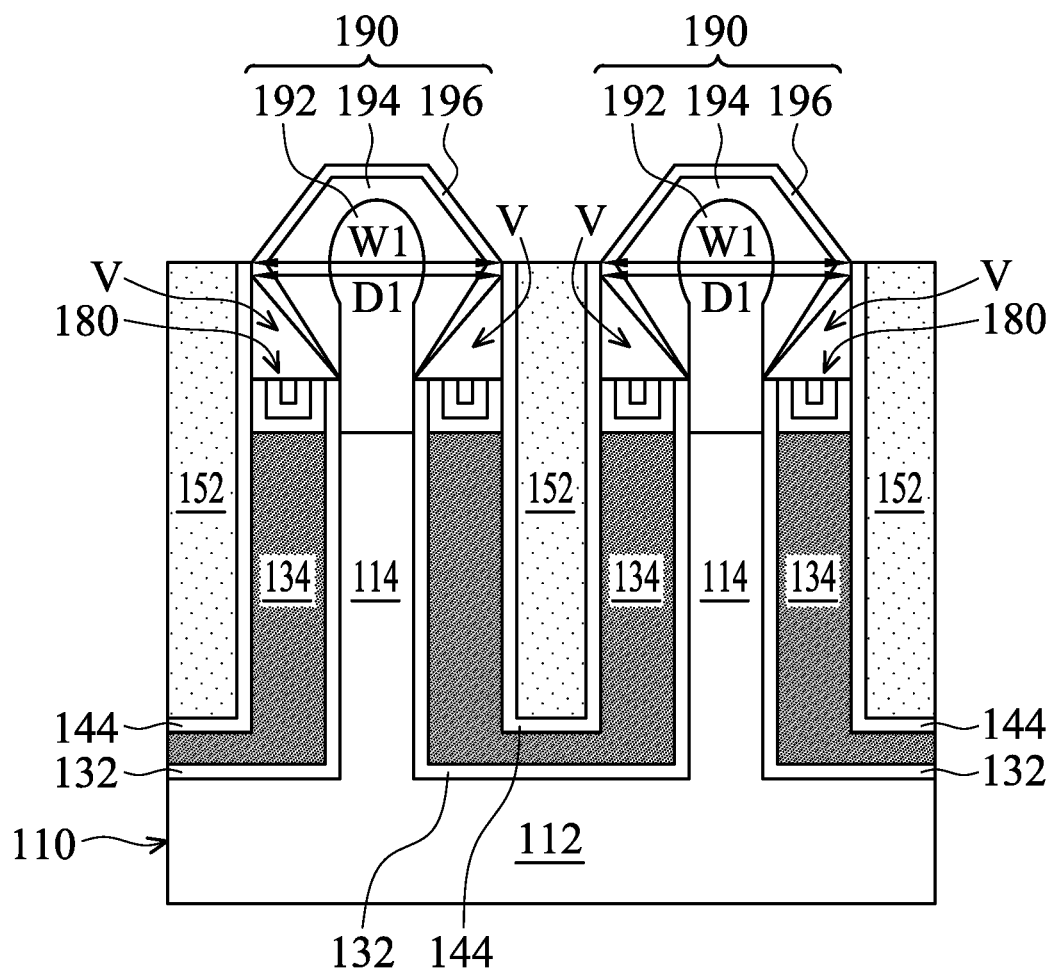

FIGS. 2A-2H are cross-sectional views of various stages of a process for forming a semiconductor device structure, in accordance with some embodiments. After the step of FIG. 2A, as shown in FIG. 2B, epitaxial structures 190 are respectively formed over the fin portions 114, in accordance with some embodiments. In some embodiments, voids V are formed.

Each void V is surrounded by the epitaxial structure 190, the spacer layer 144 (or the dielectric fin 152), and the spacer layer 180 (or the dielectric layer 134), in accordance with some embodiments. The voids V are substantially closed, in accordance with some embodiments. The epitaxial structure 190 is between two adjacent voids V, in accordance with some embodiments.

Each epitaxial structure 190 has a central portion 192, a first layer 194, and a second layer 196, in accordance with some embodiments. The central portion 192 is formed over the fin portions 114, in accordance with some embodiments. The central portion 192 is in direct contact with the fin portions 114, in accordance with some embodiments. The first layer 194 wraps around the central portion 192, in accordance with some embodiments. The second layer 196 conformally covers the first layer 194, in accordance with some embodiments. The first layer 194 is thicker than the second layer 196, in accordance with some embodiments.

The central portion 192, the first layer 194, and the second layer 196 includes a material containing silicon and the other element (e.g., germanium or phosphor), in accordance with some embodiments. The concentration of the other element in the first layer 194 is greater than the concentration of the other element in the central portion 192, in accordance with some embodiments.

The concentration of the other element in the first layer 194 is greater than the concentration of the other element in the second layer 196, in accordance with some embodiments. The central portion 192, the first layer 194, and the second layer 196 is made of silicon germanium (SiGe), silicon phosphorus (SiP), or another suitable material, in accordance with some embodiments.

The spacer layer 144 is between the epitaxial structure 190 and the dielectric fin 152, in accordance with some embodiments. The epitaxial structure 190 is between two adjacent spacer layers 144, in accordance with some embodiments. The epitaxial structure 190 is in direct contact with the two adjacent spacer layers 144, in accordance with some embodiments.

The spacer layers 144 are used to limit the maximum width W1 of the epitaxial structure 190 therebetween, in accordance with some embodiments. Therefore, the maximum width W1 is limited to the distance D1 between the two adjacent spacer layers 144, in accordance with some embodiments.

Since the distances D1 between adjacent spacer layers 144 are substantially equal to each other, the maximum widths W1 of the epitaxial structures 190 are substantially equal to each other, in accordance with some embodiments. Therefore, the width uniformity of the epitaxial structures 190 is improved, and the size variation between the epitaxial structures 190 is reduced, in accordance with some embodiments.

The term "substantially equal to" in the application means "within 10%", in accordance with some embodiments. For example, the term "substantially equal to" means the difference between the distances D1 is within 10% of the average distances between the distances D1, in accordance with some embodiments. For example, the term "substantially equal to" means the difference between the maximum widths W1 is within 10% of the average width between the epitaxial structures 190, in accordance with some embodiments. The difference may be due to manufacturing processes.

Figure 2C:
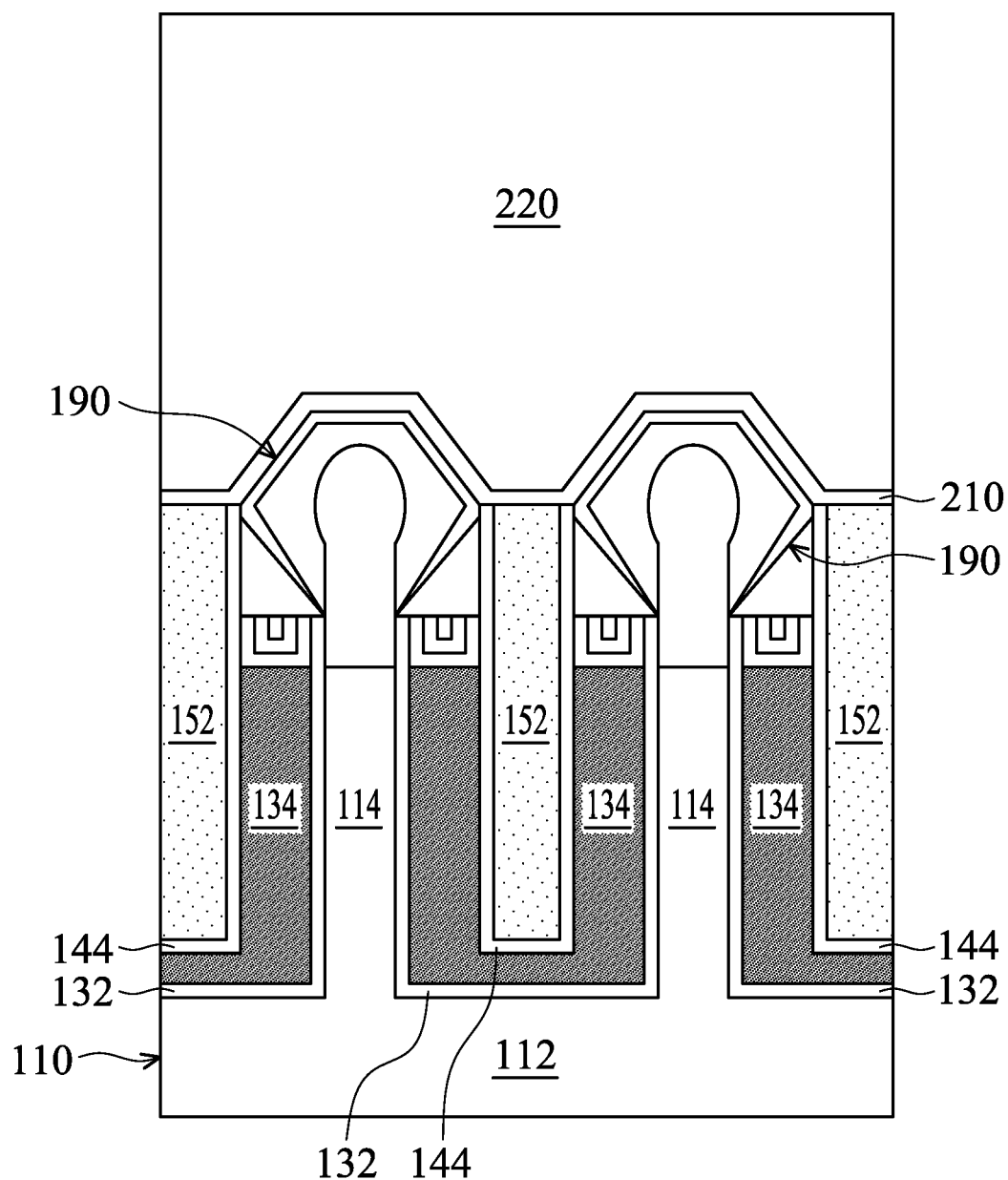

As shown in FIG. 2C, an etch stop layer 210 is conformally formed over the epitaxial structure 190, the dielectric fins 152, the spacer layers 144, the spacer layer 180, and the mask layers M1 and M2 (as shown in FIG. 1G), in accordance with some embodiments. The etch stop layer 210 is made of an insulating material, such as a nitrogen-containing material (e.g., silicon nitride), in accordance with some embodiments. The etch stop layer 210 is formed using a deposition process, such as a chemical vapor deposition (CVD) process, an atomic layer deposition (ALD) process, or a physical vapor deposition (PVD) process, in accordance with some embodiments.

As shown in FIG. 2C, a dielectric layer 220 is formed over the etch stop layer 210, in accordance with some embodiments. The dielectric layer 220 is made of any suitable insulating material, such as silicon oxide, silicon oxynitride, borosilicate glass (BSG), phosphoric silicate glass (PSG), borophosphosilicate glass (BPSG), fluorinated silicate glass (FSG), low-k material, porous dielectric material, or a combination thereof. The dielectric layer 220 is deposited by any suitable process, such as a CVD process, a spin-on process, a sputtering process, or a combination thereof, in accordance with some embodiments.

Figure 3A:
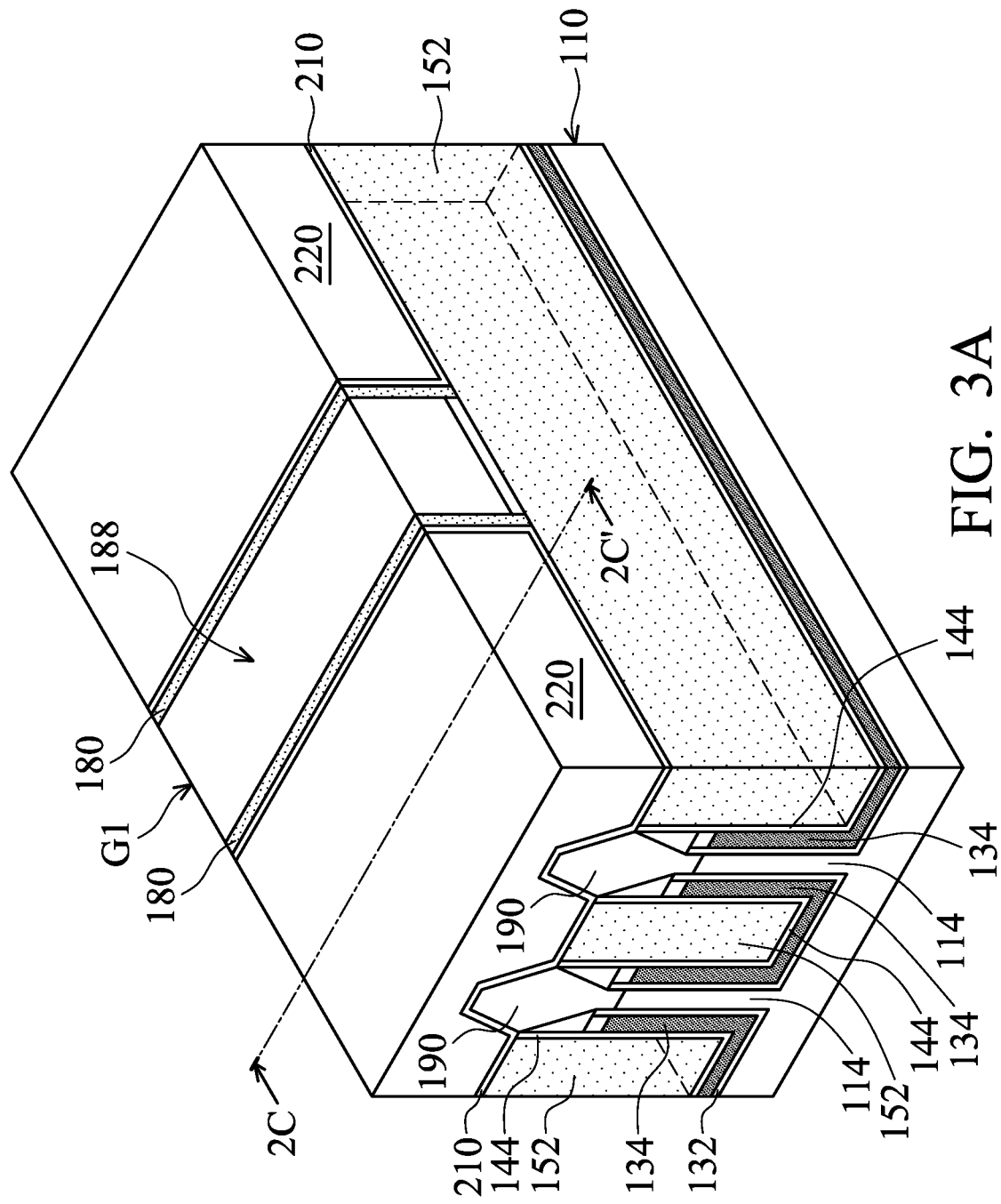
FIGS. 3A-3B are perspective views of various stages of a process for forming a semiconductor device structure, in accordance with some embodiments.
Figure 3B:
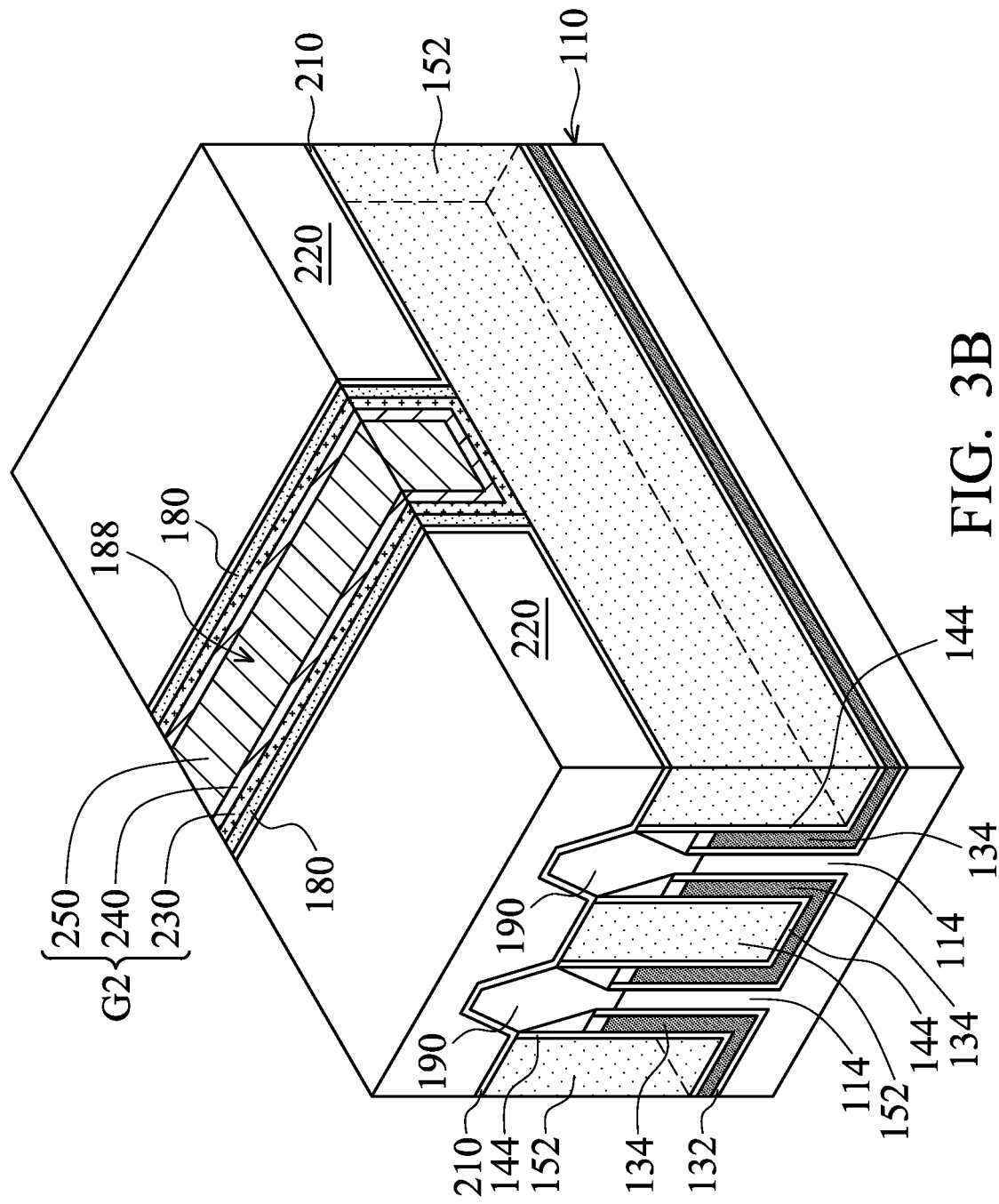

Afterwards, upper portions of the dielectric layer 220 and the mask layers M1 and M2 are removed, in accordance with some embodiments. Thereafter, a gate replacement process is performed, in accordance with some embodiments. For example, the gate replacement process is shown in FIGS. 3A and 3B. FIG. 3A is a perspective view of the semiconductor device structure of FIG. 2C, in accordance with some embodiments. FIG. 2C is a cross-sectional view illustrating the semiconductor device structure along a sectional line 2C-2C' in FIG. 3A, in accordance with some embodiments.

As shown in FIGS. 3A and 3B, the gate stack G1 is removed, in accordance with some embodiments. The spacer layer 180 has a trench 188, in accordance with some embodiments. The trench 188 exposes the dielectric fins 152, the fin portions 114, and the spacer layers 144, in accordance with some embodiments.

As shown in FIG. 3B, a gate stack G2 is formed in the trench 188, in accordance with some embodiments. The gate stack G2 includes a gate dielectric layer 230, a work function metal layer 240, and a gate electrode layer 250, in accordance with some embodiments. The gate dielectric layer 230 is conformally formed in the trench 188, in accordance with some embodiments.

The gate dielectric layer 230 is made of a dielectric material, such as a high dielectric constant (high-k) material, in accordance with some embodiments. The high-k material is made of hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), other suitable high-k dielectric materials, or combinations thereof, in accordance with some embodiments.

In some embodiments, the high-k material is made of metal oxides, metal nitrides, metal silicates, transition metal-oxides, transition metal-nitrides, transition metal-silicates, oxynitrides of metals, aluminum oxide, hafnium dioxide-alumina (HfO$_2$—Al$_2$O$_3$) alloy, other suitable materials, or combinations thereof.

The work function metal layer 240 is conformally formed over the gate dielectric layer 230, in accordance with some embodiments. The work function metal layer 240 provides a desired work function for transistors to enhance device performance including improved threshold voltage. In the embodiments of forming an NMOS transistor, the work function metal layer 240 can be an n-type metal capable of providing a work function value suitable for the device, such as equal to or less than about 4.5 eV. The n-type metal may be made of metal, metal carbide, metal nitride, or a combination thereof. For example, the n-type metal is made of tantalum, tantalum nitride, or a combination thereof.

On the other hand, in the embodiments of forming a PMOS transistor, the work function metal layer 240 can be a p-type metal capable of providing a work function value suitable for the device, such as equal to or greater than about 4.8 eV. The p-type metal may be made of metal, metal carbide, metal nitride, other suitable materials, or a combination thereof. For example, the p-type metal is made of titanium, titanium nitride, other suitable materials, or combinations thereof. The work function metal layer 240 may also be made of hafnium, zirconium, titanium, tantalum, aluminum, metal carbides (e.g., hafnium carbide, or zirconium carbide), aluminides, ruthenium or a combination thereof.

The gate electrode layer 250 is formed over the work function metal layer 240, in accordance with some embodiments. The gate electrode layer 250 is also called a metal gate electrode layer, in accordance with some embodiments. The gate electrode layer 250 is made of a suitable metal material, such as aluminum, tungsten, gold, platinum, cobalt, other suitable metal, an alloy thereof, or a combination thereof, in accordance with some embodiments.

Figure 2D:
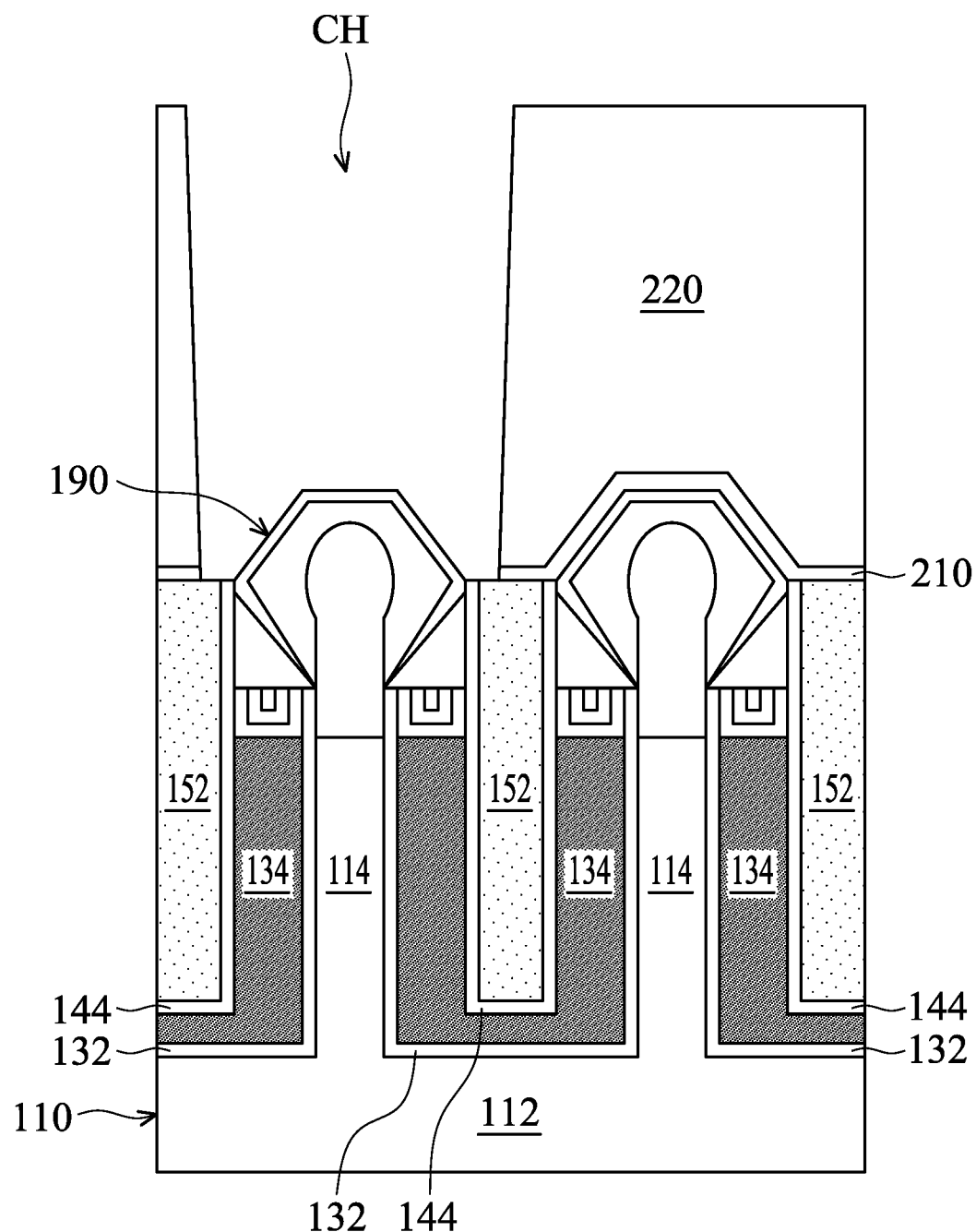

Thereafter, as shown in FIG. 2D, portions of the dielectric layer 220 and the etch stop layer 210 are removed to form a contact hole CH in the dielectric layer 220 and the etch stop layer 210, in accordance with some embodiments. The contact hole CH passes though the dielectric layer 220 and the etch stop layer 210, in accordance with some embodiments. The contact hole CH partially exposes the epitaxial structure 190 and the spacer layers 144, in accordance with some embodiments. In some embodiments, the contact hole CH partially exposes the dielectric fins 152.

Figure 2E:
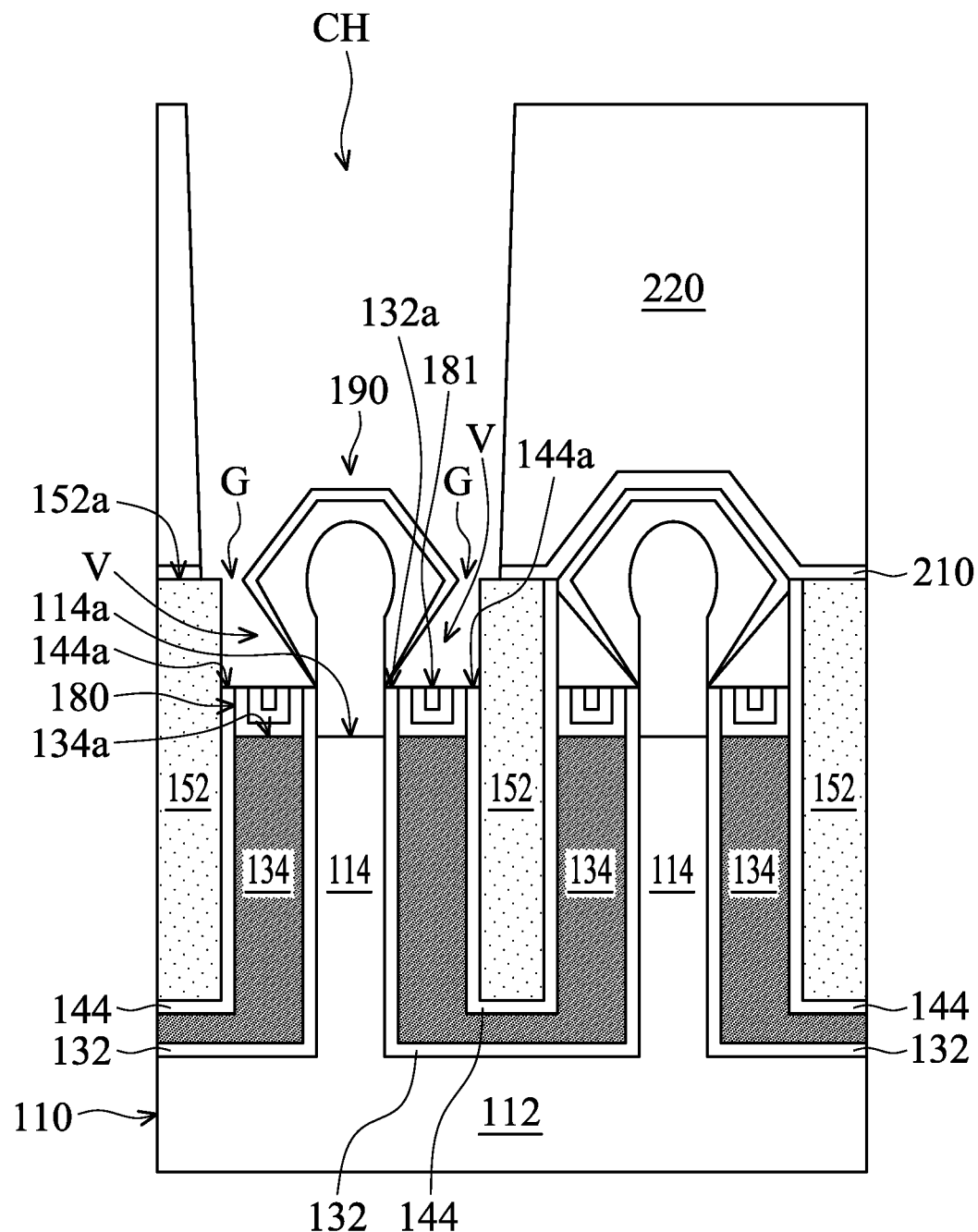

As shown in FIG. 2E, the spacer layers 144 between the epitaxial structure 190 and the dielectric fins 152 are removed through the contact hole CH, in accordance with some embodiments. After the removal process, gaps G are formed between the epitaxial structure 190 and the dielectric fins 152, in accordance with some embodiments. After the removal process, lower portions of the spacer layers 144 remain between the spacer layer 180 and the dielectric fins 152 and between the dielectric layer 134 and the dielectric fins 152, in accordance with some embodiments.

After removing the spacer layers 144 between the epitaxial structure 190 and the dielectric fins 152, the voids V communicate with the contact hole CH through the gaps G, in accordance with some embodiments. The top surface 134a of the dielectric layer 134 is lower than the top surface 144a of the spacer layer 144, in accordance with some embodiments.

The top surface 144a is lower than the top surface 152a of the dielectric fin 152, in accordance with some embodiments. The top surface 114a of the fin portion 114 is lower than the top surface 144a, in accordance with some embodiments. The top surface 181 of the spacer layer 180 is substantially coplanar with the top surfaces 144a and the top surface 132a of the liner layer 132, in accordance with some embodiments.

Figure 2F:
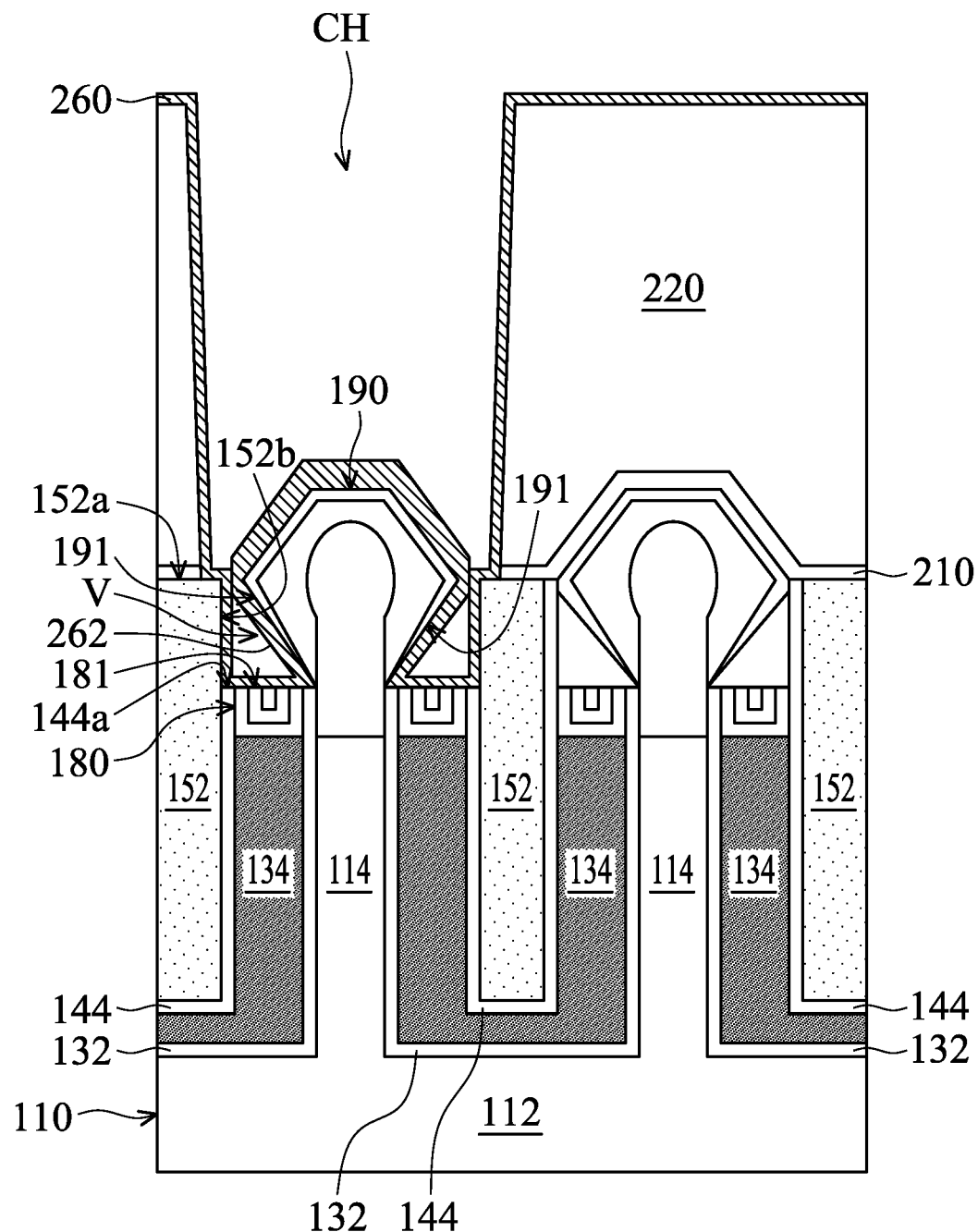

As shown in FIG. 2F, a metal layer 260 is formed over the epitaxial structure 190, in accordance with some embodiments. In some embodiments, a lower portion 262 of the metal layer 260 covers a lower surface 191 of the epitaxial structure 190. The lower portion 262 is in the voids V, in accordance with some embodiments. The lower portion 262 conformally covers sidewalls 152b of the dielectric fins 152, the top surface 181 of the spacer layer 180, and the top surfaces 144a of the spacer layers 144, in accordance with some embodiments.

The metal layer 260 is made of Ti, Co, Ru, or another suitable metal material. The metal layer 260 is formed using a deposition process, such as a physical vapor deposition process, a plating process, another suitable method, or a combination thereof, in accordance with some embodiments.

Figure 2G:
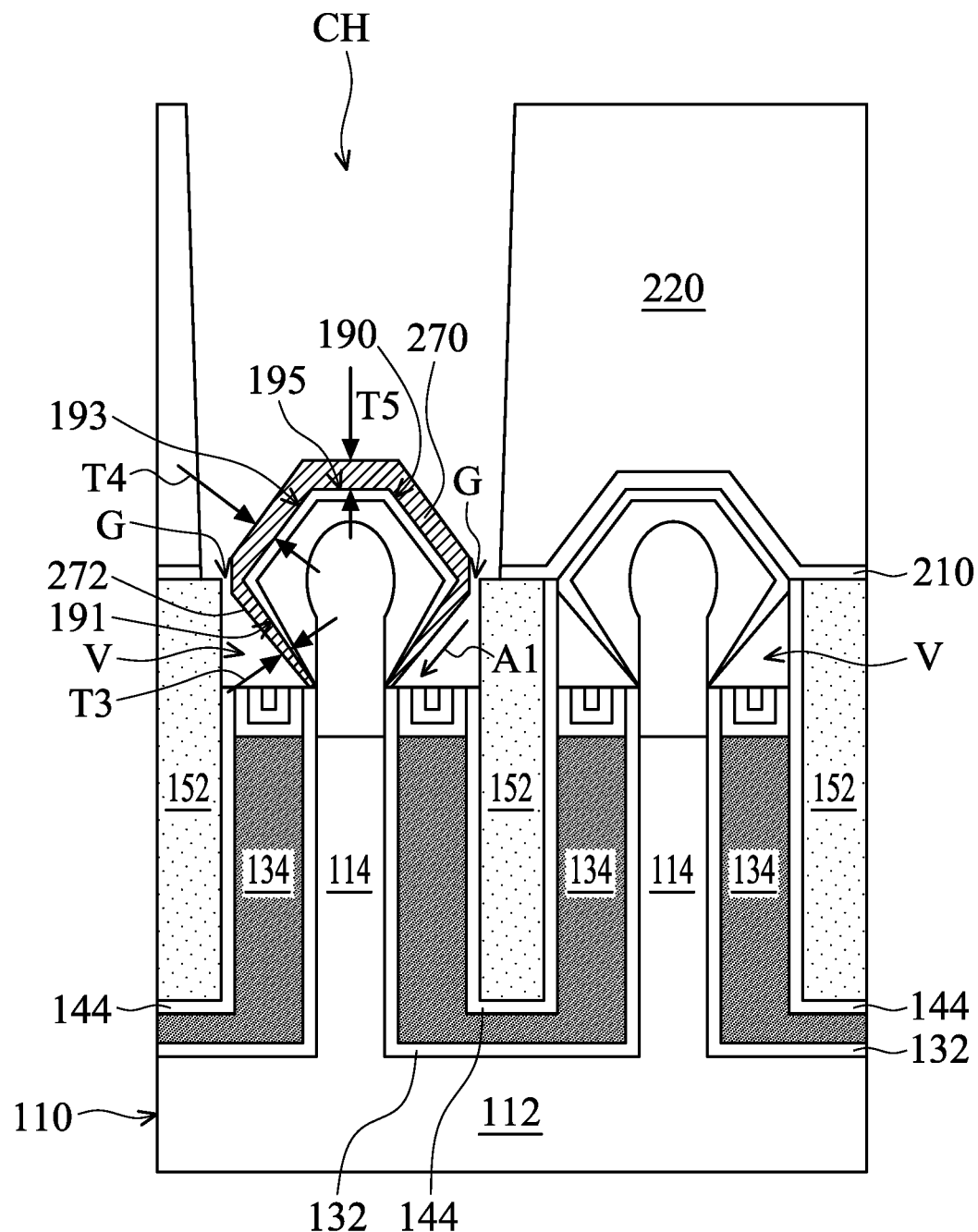

As shown in FIGS. 2F and 2G, the metal layer 260 and the epitaxial structure 190 are annealed to react the metal layer 260 with the epitaxial structure 190 so as to form a silicide layer 270 between the metal layer 260 and the epitaxial structure 190, in accordance with some embodiments. The silicide layer 270 wraps around the epitaxial structure 190, in accordance with some embodiments.

The silicide layer 270 conformally covers the lower surface 191, an upper surface 193, and a top surface 195 of the epitaxial structure 190, in accordance with some embodiments. In some embodiments, a lower portion 272 of the silicide layer 270 conformally covers the lower surface 191. The lower portion 272 is in the voids V, in accordance with some embodiments.

The thickness T3 of the silicide layer 270 over the lower surface 191 is less than the thickness T4 of the silicide layer 270 over the upper surface 193, in accordance with some embodiments. The thickness T4 is less than the thickness T5 of the silicide layer 270 over the top surface 195, in accordance with some embodiments. The thickness T3 decreases along a direction A1 from a boundary between the upper surface 193 and the lower surface 191 toward the fin portion 114, in accordance with some embodiments. That is, the thickness T3 decreases along the lower surface 191 toward the fin portion 114, in accordance with some embodiments.

The average thickness of the silicide layer 270 ranges from about 2 nm to about 10 nm, in accordance with some embodiments. The average thickness of the silicide layer 270 ranges from about 3 nm to about 5 nm, in accordance with some embodiments. The metal silicide layers 270 include TiSi$_2$ (titanium disilicide), CoSi2, or RuSi, in accordance with some embodiments.

Since the metal layer 260 is deposited onto the lower surface 191 of the epitaxial structure 190 through the gaps G, the silicide layer 270 is able to be formed over the lower surface 191. Therefore, the formation of the gap G increases the contact area between the silicide layer 270 and the epitaxial structure 190. As a result, the contact resistance between the silicide layer 270 and the epitaxial structure 190 is decreased.

As shown in FIG. 2G, the metal layer 260, which has not reacted with the epitaxial structure 190, is removed, in accordance with some embodiments. The removal process includes an etching process such as a wet etching process or a dry etching process, in accordance with some embodiments.

Figure 2H:
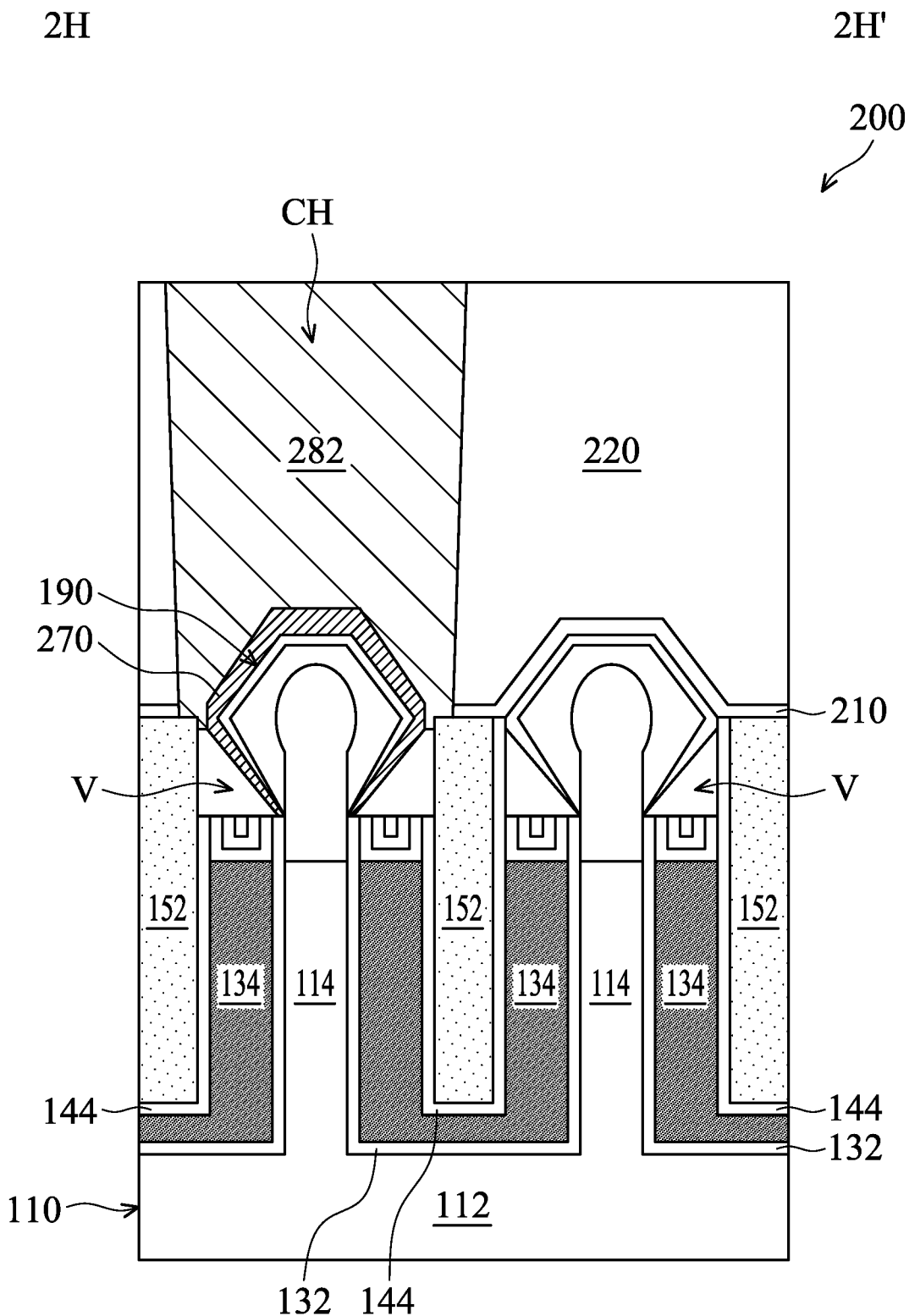

As shown in FIG. 2H, a contact structure 282 is formed in the contact hole CH, in accordance with some embodiments. The contact structure 282 passes through the dielectric layer 220 and the etch stop layer 210 to connect to the silicide layer 270, in accordance with some embodiments.

The formation of the contact structure 282 includes depositing a conductive material layer (not shown) over the dielectric layer 220 and in the contact hole CH; and performing a chemical mechanical polishing (CMP) process over the conductive material layer to remove the conductive material layer outside of the contact hole CH.

Figures 1, 2H:
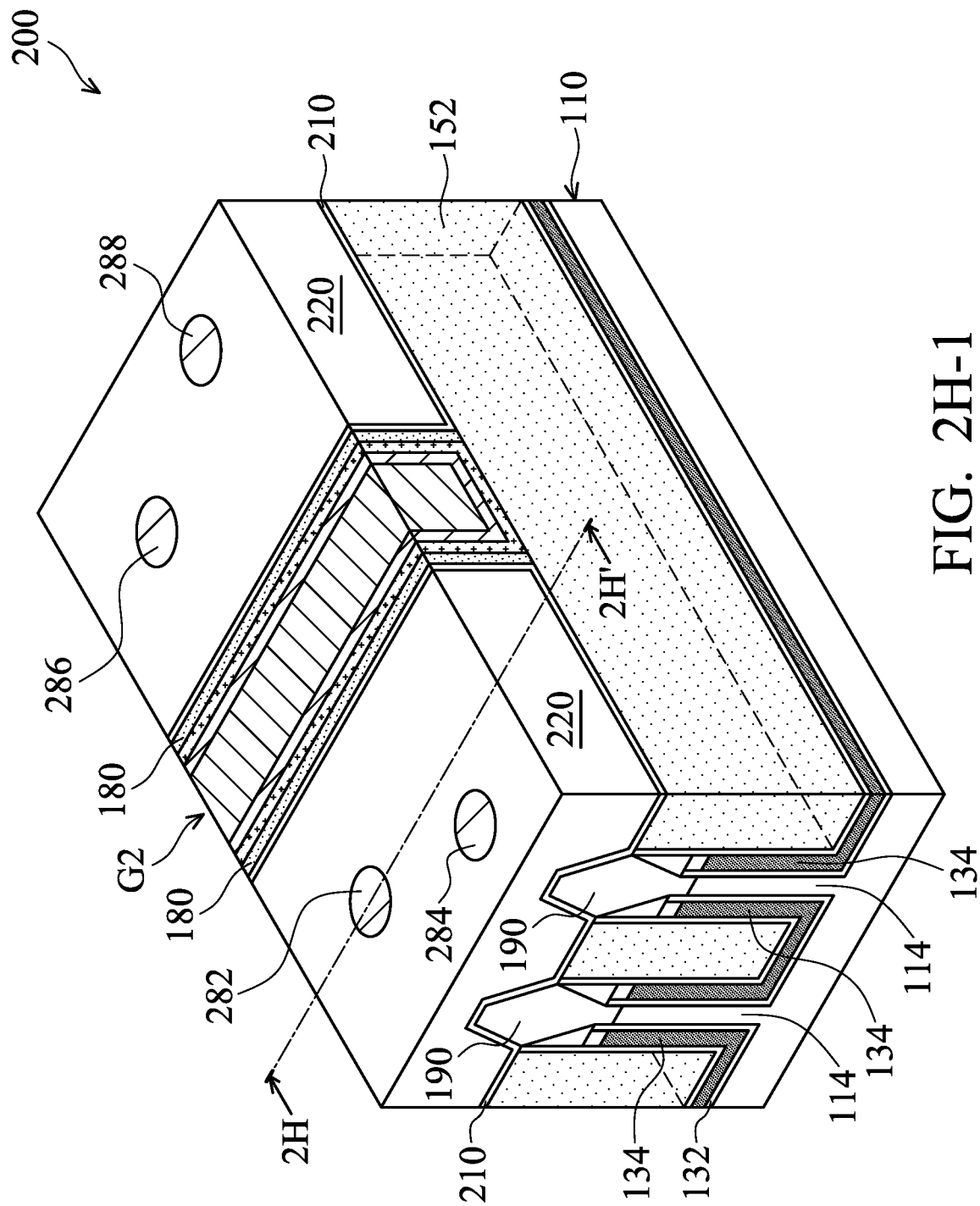

FIG. 2H-1 is a perspective view of the semiconductor device structure of FIG. 2H, in accordance with some embodiments. FIG. 2H is a cross-sectional view illustrating the semiconductor device structure along a sectional line 2H-2H' in FIG. 2H-1, in accordance with some embodiments.

As shown in FIGS. 2H and 2H-1, in some embodiments, the steps of FIGS. 2F-2H are also performed over other portions of the dielectric layer 220 and the etch stop layer 210 to form contact structures 284, 286, and 288 in the dielectric layer 220 and the etch stop layer 210, in accordance with some embodiments. The contact structures 284, 286, and 288 pass through the dielectric layer 220 and the etch stop layer 210 to connect to the silicide layers 270 thereunder, in accordance with some embodiments. The contact structures 282, 284, 286, and 288 are formed at the same time, in accordance with some embodiments. The contact structures 282, 284, 286, and 288 are made of tungsten (W) or another suitable conductive material, in accordance with some embodiments. In this step, a semiconductor device structure 200 is substantially formed, in accordance with some embodiments.

Figure 4:
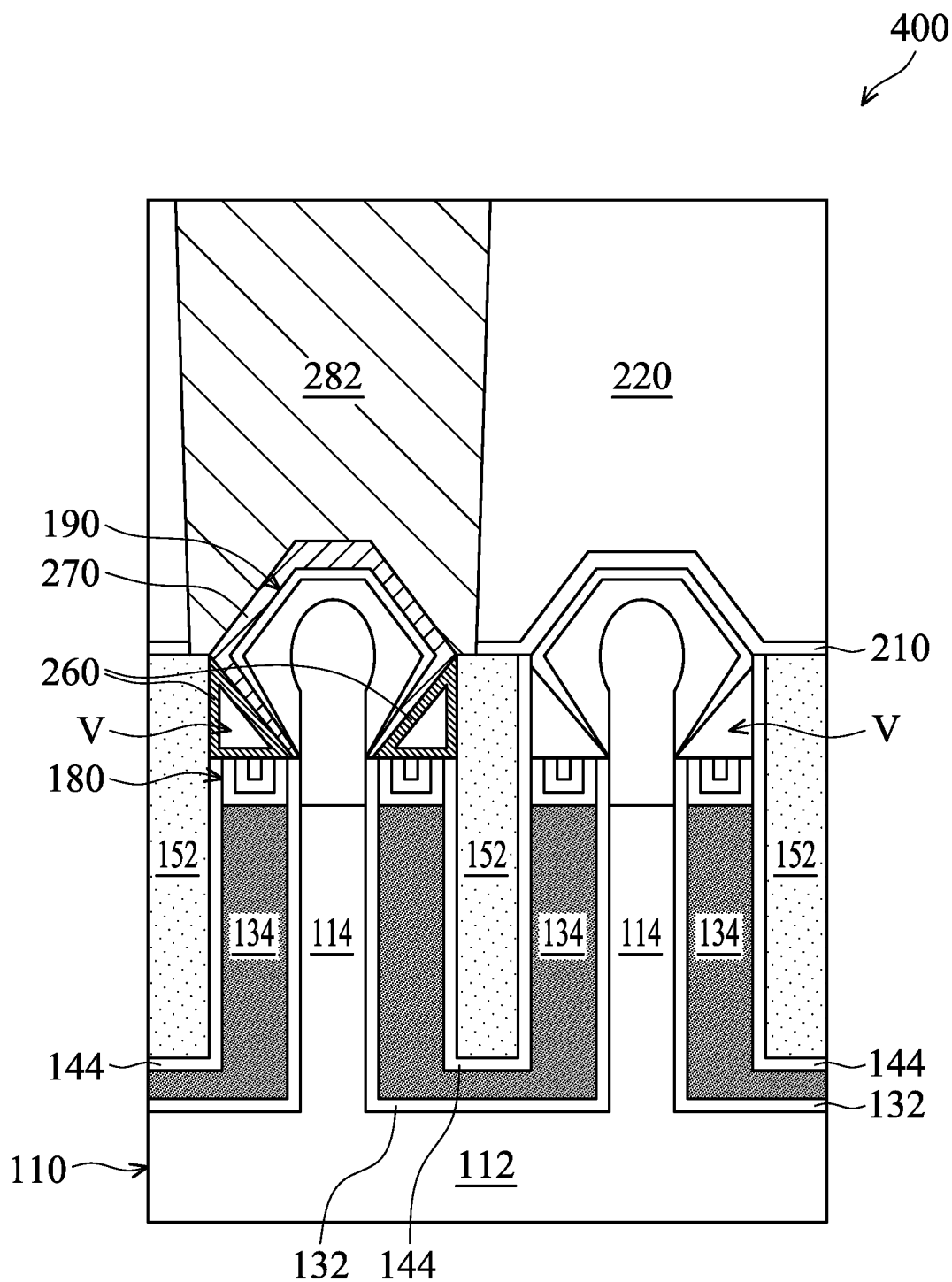
FIG. 4 is a cross-sectional view of a semiconductor device structure, in accordance with some embodiments.

FIG. 4 is a cross-sectional view of a semiconductor device structure 400, in accordance with some embodiments. As shown in FIG. 4, the semiconductor device structure 400 is similar to the semiconductor device structure 200 of FIGS. 2H and 2H-1, except that the silicide layer 270 of the semiconductor device structure 400 is in direct contact with the dielectric fins 152, in accordance with some embodiments. In some embodiments, a portion of the metal layer 260, which has not reacted with the epitaxial structure 190, remains in the voids V.

Figure 5:
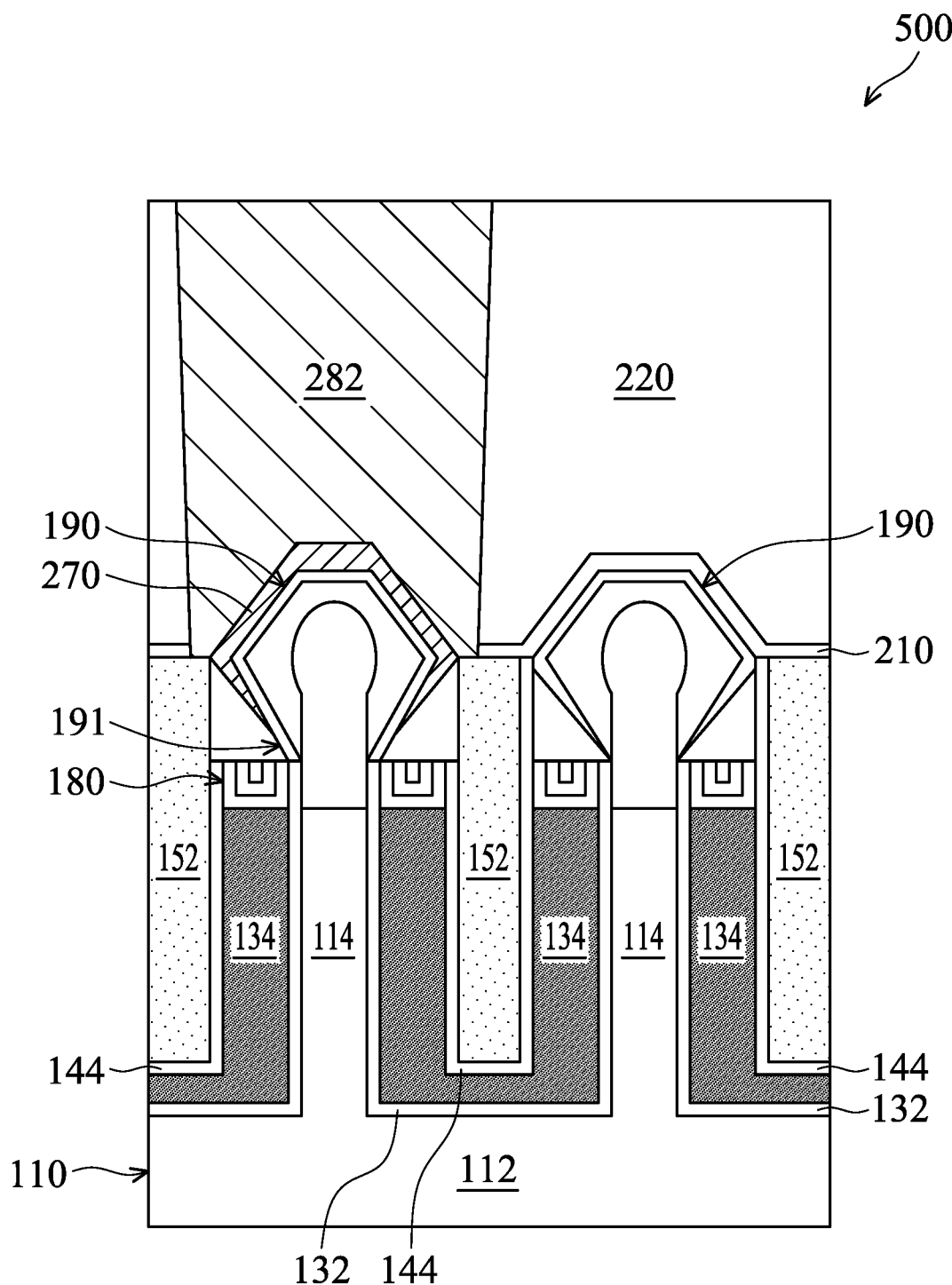
FIG. 5 is a cross-sectional view of a semiconductor device structure, in accordance with some embodiments.

FIG. 5 is a cross-sectional view of a semiconductor device structure 500, in accordance with some embodiments. As shown in FIG. 5, the semiconductor device structure 500 is similar to the semiconductor device structure 200 of FIGS. 2H and 2H-1, except that the silicide layer 270 of the semiconductor device structure 500 only covers an upper portion of the lower surface 191, in accordance with some embodiments. That is, the silicide layer 270 exposes a lower portion of the lower surface 191, in accordance with some embodiments.

Processes and materials for forming the semiconductor structures 400 and 500 may be similar to, or the same as, those for forming the semiconductor structure 200 described above.

In accordance with some embodiments, semiconductor device structures and methods for forming the same are provided. The methods (for forming the semiconductor device structure) include forming a spacer layer between a fin portion and a dielectric fin; forming an epitaxial structure over the fin portion; removing the spacer layer between the epitaxial structure and the fin portion; and forming a silicide layer that wraps around the epitaxial structure. After the removal of the spacer layer, a gap is formed between the epitaxial structure and the dielectric fin. Therefore, the silicide layer is able to pass through the gap to cover an upper portion and a lower portion of the epitaxial structure. As a result, the formation of the gap increases the contact area between the silicide layer and the epitaxial structure and therefore decreases the contact resistance between the silicide layer and the epitaxial structure. Therefore, the performance of the semiconductor device structure is improved.

In accordance with some embodiments, a semiconductor device structure is provided. The semiconductor device structure includes a substrate having a base portion and a fin portion over the base portion. The semiconductor device structure includes an epitaxial structure over the fin portion. The semiconductor device structure includes a dielectric fin over the base portion. The semiconductor device structure includes a silicide layer between the dielectric fin and the epitaxial structure. A void is between the silicide layer and the dielectric fin.

In accordance with some embodiments, a semiconductor device structure is provided. The semiconductor device structure includes a substrate having a base portion and a fin portion over the base portion. The semiconductor device structure includes an epitaxial structure over the fin portion. The semiconductor device structure includes a dielectric fin over the base portion. The dielectric fin is spaced apart from the epitaxial structure. The semiconductor device structure includes a silicide layer wrapping around the epitaxial structure. A first lower portion of the silicide layer is between the epitaxial structure and the base portion.

In accordance with some embodiments, a semiconductor device structure is provided. The semiconductor device structure includes a substrate having a base portion and a fin portion over the base portion. The semiconductor device structure includes an epitaxial structure over the fin portion. The semiconductor device structure includes a liner layer over a sidewall of the fin portion. The semiconductor device structure includes a dielectric fin over the base portion. The dielectric fin is spaced apart from the epitaxial structure. The semiconductor device structure includes a silicide layer wrapping around the epitaxial structure. A thickness of the silicide layer decreases toward the liner layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
   a substrate having a base portion and a fin portion over the base portion;
   an epitaxial structure over the fin portion;
   a dielectric fin over the base portion; and
   a silicide layer between the dielectric fin and the epitaxial structure, wherein a void is between the silicide layer and the dielectric fin.

2. The semiconductor device structure as claimed in claim 1, wherein a width of the void increases toward the base portion.

3. The semiconductor device structure as claimed in claim 1, wherein a distance between the void and the epitaxial structure decreases toward the base portion.

4. The semiconductor device structure as claimed in claim 1, wherein the silicide layer wraps around the epitaxial structure.

5. The semiconductor device structure as claimed in claim 1, further comprising:
a contact structure over the silicide layer and the dielectric fin.

6. The semiconductor device structure as claimed in claim 5, wherein the contact structure is partially between the silicide layer and the dielectric fin.

7. The semiconductor device structure as claimed in claim 5, wherein a lower portion of the silicide layer is not covered by the contact structure.

8. The semiconductor device structure as claimed in claim 7, wherein the void is surrounded by the silicide layer, the contact structure, and the dielectric fin.

9. The semiconductor device structure as claimed in claim 1, further comprising:
a metal layer covering the silicide layer and the dielectric fin, wherein the void is in the metal layer.

10. A semiconductor device structure, comprising:
a substrate having a base portion and a fin portion over the base portion;
an epitaxial structure over the fin portion;
a dielectric fin over the base portion, wherein the dielectric fin is spaced apart from the epitaxial structure; and
a silicide layer wrapping around the epitaxial structure, wherein a first lower portion of the silicide layer is between the epitaxial structure and the base portion.

11. The semiconductor device structure as claimed in claim 10, wherein the silicide layer exposes a second lower portion of a lower surface of the epitaxial structure.

12. The semiconductor device structure as claimed in claim 10, wherein the silicide layer has an upper portion, the upper portion is higher than the dielectric fin, and the upper portion is thicker than the first lower portion.

13. The semiconductor device structure as claimed in claim 10, further comprising:
a spacer layer over a first sidewall of the dielectric fin, wherein the first sidewall faces the fin portion of the substrate, and the spacer layer is lower than the epitaxial structure.

14. The semiconductor device structure as claimed in claim 13, wherein the spacer layer exposes an upper portion of the first sidewall of the dielectric fin.

15. The semiconductor device structure as claimed in claim 14, wherein the dielectric fin has a second sidewall opposite to the first sidewall, the spacer layer covers the second sidewall, and a first top surface of the spacer layer over the second sidewall is substantially level with a second top surface of the dielectric fin.

16. A semiconductor device structure, comprising:
a substrate having a base portion and a fin portion over the base portion;
an epitaxial structure over the fin portion;
a liner layer over a sidewall of the fin portion;
a dielectric fin over the base portion, wherein the dielectric fin is spaced apart from the epitaxial structure; and
a silicide layer wrapping around the epitaxial structure, wherein a thickness of the silicide layer decreases toward the liner layer.

17. The semiconductor device structure as claimed in claim 16, wherein a bottom portion of the silicide layer is in direct contact with the liner layer.

18. The semiconductor device structure as claimed in claim 16, wherein the liner layer conformally covers the fin portion and the base portion.

19. The semiconductor device structure as claimed in claim 16, further comprising:
a dielectric layer between the liner layer and the dielectric fin.

20. The semiconductor device structure as claimed in claim 19, wherein the dielectric layer wraps around a lower portion of the dielectric fin.

* * * * *